(12) United States Patent
Zhang

(10) Patent No.: US 11,711,164 B2
(45) Date of Patent: *Jul. 25, 2023

(54) METHOD AND DEVICE IN UE AND BASE STATION USED FOR CHANNEL CODING

(71) Applicant: Xiaobo Zhang, Shanghai (CN)

(72) Inventor: Xiaobo Zhang, Shanghai (CN)

(73) Assignee: SHANGHAI LANGBO COMMUNICATION TECHNOLOGY COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/586,816

(22) Filed: Jan. 28, 2022

(65) Prior Publication Data

US 2022/0158761 A1 May 19, 2022

Related U.S. Application Data

(63) Continuation of application No. 16/505,735, filed on Jul. 9, 2019, now Pat. No. 11,283,546, which is a
(Continued)

(30) Foreign Application Priority Data

Jan. 9, 2017 (CN) .......................... 201710012223.3
Jan. 22, 2017 (CN) .......................... 201710045440.2

(51) Int. Cl.
*H04L 12/28* (2006.01)
*H04L 1/00* (2006.01)
(Continued)

(52) U.S. Cl.
CPC .......... *H04L 1/0063* (2013.01); *H04L 1/0055* (2013.01); *H04L 1/0643* (2013.01);
(Continued)

(58) Field of Classification Search
CPC .............................. H04L 12/28; H04L 12/50
(Continued)

(56) References Cited

U.S. PATENT DOCUMENTS

2020/0119884 A1    4/2020 Jiang et al.
2022/0353826 A1*  11/2022 Liu ....................... H04W 76/27

OTHER PUBLICATIONS

Response to the Non-Final Rejection of U.S. Appl. No. 16/505,735, dated Jul. 20, 2021.
(Continued)

*Primary Examiner* — Dang T Ton

(57) ABSTRACT

The present disclosure discloses a method and a device in a User and a base station used for channel coding. A first node determines a first bit block; performs channel coding; and transmits a first radio signal. Bits in the first bit block are used to generate bits in a second bit block. The bits in the first bit block and in the second bit block are used for an input to the channel coding, an output after the channel coding is used to generate the first radio signal. Channel coding is based on a polar code. A sub-channel occupied by a target first type bit is related to the number of bits in the second bit block related to the target first type bit. The target first type bit belongs to the first bit block. The disclosure can improve decoding performance of polar codes and reduce complexity of decoding.

20 Claims, 11 Drawing Sheets

Related U.S. Application Data continuation of application No. PCT/CN2018/071701, filed on Jan. 8, 2018.

(51) Int. Cl.
    *H04L 1/06*       (2006.01)
    *H04L 1/1867*    (2023.01)
    *H04W 72/044*   (2023.01)
    *H04W 72/20*    (2023.01)

(52) U.S. Cl.
    CPC ....... *H04L 1/1893* (2013.01); *H04W 72/0466* (2013.01); *H04W 72/20* (2023.01)

(58) Field of Classification Search
    USPC .......................................................... 370/329
    See application file for complete search history.

(56) References Cited

OTHER PUBLICATIONS

Non-Final Rejection of the U.S. Appl. No. 16/505,735, dated Jul. 20, 2021.
Non-Final Rejection of the U.S. Appl. No. 16/505,735, dated Dec. 11, 2020.
Final Rejection of the U.S. Appl. No. 16/505,735, dated Apr. 2, 2021.
3GPP Draft; R1-1611254 Details of the Polar Code Design, vol. RAN WG1, No. Reno, USA;2016111Q-20161114 Nov. 13, 2016 (Nov. 13, 2016).

\* cited by examiner

METHOD AND DEVICE IN UE AND BASE STATION USED FOR CHANNEL CODING

CROSS-REFERENCE TO RELATED APPLICATION

This application is a continuation of the U.S. patent application Ser. No. 16/505,735, filed on Jul. 9, 2019, which is a continuation of International Application No. PCT/CN2018/071701, filed Jan. 8, 2018, claiming the priority benefit of Chinese Patent Application Serial Number 201710012223.3, filed on Jan. 9, 2017, and Chinese Patent Application Serial Number 201710045440.2, filed on Jan. 22, 2017, the full disclosure of which is incorporated herein by reference.

BACKGROUND

Technical Field

The present disclosure relates to transmission schemes for radio signals in wireless communication systems, and in particular to a method and a device of transmission for channel coding.

Related Art

Polar Codes are coding schemes first proposed by Professor Erdal Arikan from University of Birken in Turkey in 2008, which may realize the code construction method of the capacity of a symmetrical Binary input Distributed Memoryless Channel (B-DMC). At the 3rd Generation Partner Project (3GPP) RAN1#87 conference, the 3GPP determined the use of a Polar code scheme as a control channel coding scheme of the 5G Enhanced Mobile Broadband (eMBB) scenario.

In the traditional Long Term Evolution (LTE) system, Cyclic Redundancy Check (CRC) has specific functions of error check and target receiver identification. As for polar codes, some 3GPP papers (for example, R1-1611254) have designed special check bits for polar codes to ensure that these polar codes can be used for pruning in channel decoding.

SUMMARY

The inventors have found through researches that since different sub-channels of polar codes correspond to different channel capacities, information bits mapped to different sub-channels may experience varied Bit Error Rate (BERs), therefore, how redundant bits can be effectively utilized to improve decoding performance becomes a problem needed to be solved.

In view of the above problem, the present disclosure provides a solution. It should be noted that, in the case of no conflict, the embodiments of the present disclosure and the characteristics in the embodiments may be combined with each other arbitrarily. For example, embodiments in a first node of the present disclosure and the characteristics in the embodiments may be applied to a second node, and vice versa.

The present disclosure discloses a method in a first node for wireless communication, comprising:
  determining a first bit block;
  performing channel coding; and
  transmitting a first radio signal;

wherein bits in the first bit block are used to generate bits in a second bit block; the bits in the first bit block and the bits in the second bit block are both used for an input to the channel coding, an output after the channel coding is used to generate the first radio signal; the channel coding is based on a polar code; for the channel coding, a sub-channel occupied by a target first type bit is related to at least one of a number of bits in the second bit block related to the target first type bit, or numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer.

In one embodiment, the above method is advantageous in that redundancy of check bits related to the target first type bit can be determined based on transmission reliability of the sub-channel occupied by the target first type bit. By offering Unequal Error Protection to bits on different sub-channels, bits transmitted on a sub-channel with weaker reliability can be subjected to stronger error protection to improve transmission reliability thereof.

In one embodiment, the sub-channel refers to a position in an input bit sequence of Arikan polar encoder.

In one subembodiment of the above embodiment, an output after the input bit sequence is multiplied by a polar coding matrix is the output after the channel coding. The polar coding matrix is acquired as a product of a bit reversal permutation matrix and a first matrix, the first matrix is the n-th Kronecker power of a kernel matrix, the n is the logarithm of a length of the input bit sequence with base 2, the kernel matrix is a matrix with 2 rows and 2 columns, wherein two elements in a first row are 1 and 0, respectively, and other two elements in a second row are both 1.

In one embodiment, the phrase that the sub-channel occupied by the target first type bit is related to at least one of a number of bits in the second bit block related to the target first type bit, or numbers of bits in K first type bit sets refers to: a channel capacity of a sub-channel occupied by the target first type bit is related to at least one of a number of bits in the second bit block related to the target bit or numbers of bits in K first type bits sets.

In one embodiment, the capacity of the sub-channel is: an upper bound of information rate of reliable transmission on the sub-channel.

In one embodiment, part of the bits in the first bit block are not related to the bits in the second bit block.

In one embodiment, the first bit block is generated on a physical layer of the first node.

In one embodiment, the first node is a base station, the first node generates the first bit block based on a result of scheduling.

In one embodiment, the first node is a UE, the first node generates the first bit block based on scheduling of a base station.

In one embodiment, for any bit in the second bit block, the any bit is equal to a sum of a positive integer number of bit(s) in the first bit block subjected to mod2.

In one embodiment, for any bit in the second bit block, the any bit is acquired after a sum of a positive integer number of bit(s) in the first bit block is subjected to mod2 and then to Xor operation with a corresponding bit in a scrambling sequence.

In one embodiment, the second bit block is not related to bits other than the first bit block.

In one embodiment, the input to the channel coding includes all bits in the first bit block, all bits in the second bit block and all bits in a third bit block. Values of all bits in the third bit block are pre-set.

In one subembodiment of the above embodiment, all bits in the third bit block are 0, respectively.

In one subembodiment of the above embodiment, the bits in the third bit block are related to an identifier of the first node.

In one subembodiment of the above embodiment, an identifier of the first node is used to generate the bits in the third bit block.

In one subembodiment of the above embodiment, the bits in the third bit block are related to an identifier of a target receiver of the first radio signal.

In one subembodiment of the above embodiment, the identifier of the target receiver of the first radio signal is used to generate the bits in the third bit block.

In one embodiment, the first radio signal is transmitted on a physical layer control channel (i.e., a physical layer channel that cannot be used for transmitting physical layer data).

In one embodiment, the first radio signal is transmitted on a physical layer data channel (i.e., a physical layer channel that can be used for bearing physical layer data).

In one embodiment, the first node is a UE.

In one subembodiment of the above embodiment, the first radio signal is transmitted on a Physical UplinkControl Channel (PUCCH).

In one subembodiment of the above embodiment, the first radio signal is transmitted on a Physical Uplink Shared CHannel (PUSCH).

In one embodiment, the first node is a base station.

In one subembodiment of the above embodiment, the first radio signal is transmitted on a Physical Downlink Shared CHannel (PDSCH).

In one subembodiment of the above embodiment, the first radio signal is transmitted on a Physical DownlinkControl Channel (PDCCH).

In one embodiment, the first radio signal is an output after the output of the channel coding is sequentially subjected to Channel Coding, Scrambling, a Modulation Mapper, a Layer Mapper, Precoding, a Resource Element Mapper and broadband symbol generation.

In one embodiment, the first radio signal is an output after the output of the channel coding is sequentially subjected to scrambling, a Modulation Mapper, a Layer Mapper, a transform precoder, Precoding, a Resource Element Mapper and broadband symbol generation.

In one embodiment, the broadband symbol is an Orthogonal Frequency Division Multiplexing (OFDM) symbol.

In one embodiment, the broadband symbol is a Filter Bank Multi Carrier (FBMC) symbol.

Specifically, according to one aspect of the present disclosure, wherein the higher the number of the bits in the second bit block related to the target first type bit is, the lower a channel capacity corresponding to the sub-channel occupied by the target first type bit will be.

In one embodiment, the higher the number of the bits in the second bit block related to the target first type bit is, the more a Bit Error Rate (BER) of the target first type bit will be reduced. As a result, the target first type bit should be mapped to a sub-channel with lower channel capacity so as to average BERs corresponding to the bits in the first bit block.

In one embodiment, a channel capacity of a sub-channel occupied by a first given bit is less than a channel capacity of a sub-channel occupied by a second given bit, the number of bits in the second bit block related to the first given bit is greater than the number of bits in the second bit block related to the second given bit.

Specifically, according to one aspect of the present disclosure, wherein the less a sum of the numbers of the bits in the K first type bit sets is, the lower a channel capacity corresponding to the sub-channel occupied by the target first type bit will be.

In one embodiment, the K is equal to 1.

In one embodiment, the K is greater than 1.

In one embodiment, the K remains unchanged in the above aspect.

In one embodiment, given that other conditions are the same, the less a sum of the numbers of the bits in the K first type bit sets is, the more a BER of the target first type bit will be reduced. As a result, the target first type bit should be mapped to a sub-channel with lower channel capacity so as to average BERs corresponding to the bits in the first bit block.

In one embodiment, a sum of numbers of bits in K1 first type bit sets is less than a sum of number of bits in K2 first type bit sets. The K1 first type bit sets respectively correspond to K1 second type bits, the K1 second type bits are all bits in the second bit block related to a first given bit. The K2 first bit sets respectively correspond to K2 second type bits, the K2 second type bits are all bits in the second bit block related to a second given bit. The K1 and the K2 are positive integers, respectively. A channel capacity of a sub-channel occupied by the first given bit is smaller than a channel capacity of a sub-channel occupied by the second given bit. The first given bit and the second given bit both belong to the first bit block.

In one embodiment, the K1 is equal to the K2.

Specifically, according to one aspect of the present disclosure, wherein the greater a sum of reciprocals of the numbers of the bits in the K first type bit sets is, the lower a channel capacity corresponding to the sub-channel occupied by the target first type bit will be.

In one embodiment, the greater a sum of K rational numbers is, the lower the channel capacity corresponding to the sub-channel occupied by the target first type bit will be. The K rational numbers respectively correspond to the K first type bit sets, any rational number of the K rational numbers is a reciprocal of a number of bits in a corresponding first type bit set.

In one embodiment, given that other conditions are the same, the greater a sum of reciprocals of the numbers of the bits in the K first type bit sets is, the more a BER of the target first type bit will be reduced. As a result, the target first type bit should be mapped to a sub-channel with lower channel capacity so as to average BERs corresponding to the bits in the first bit block.

In one embodiment, the K remains unchanged in the above aspect.

In one embodiment, a sum of reciprocals of numbers of bits in K1 first type bit sets is greater than a sum of reciprocals of numbers of bits in K2 first type bit sets. The K1 first type bit sets respectively correspond to the K1 second type bits, the K1 second type bits are all bits in the second bit block related to a first given bit. The K2 first bit sets respectively correspond to K2 second type bits; the K2 second type bits are all bits in the second bit block related to a second given bit. The K1 and the K2 are positive integers, respectively. A channel capacity of a sub-channel occupied by the first given bit is smaller than a channel capacity of a sub-channel occupied by the second given bit. The first given bit and the second given bit both belong to the first bit block.

In one embodiment, the K1 is equal to the K2.

Specifically, according to one aspect of the present disclosure, wherein the first bit block comprises a first bit sub-block and a second bit sub-block, a CRC bit block of the first bit sub-block is used to generate the second bit sub-block.

In one embodiment, the first bit sub-block and the second bit sub-block constitute the first bit block.

In one embodiment, the second bit sub-block is a CRC bit block of the first bit sub-block.

In one embodiment, the second bit sub-block is a bit block after the CRC bit block of the first bit sub-block is subjected to scrambling.

In one embodiment, a scrambling sequence employed in the scrambling is related to an identifier of the first node.

In one embodiment, the first node is a UE, an identifier of the first node is a Radio Network Temporary Identifier (RNTI).

In one embodiment, the first node is a base station, an identifier of the first node is a Physical Cell Identifier (PCI).

In one embodiment, a scrambling sequence employed in the scrambling is related to an identifier of a target receiver of the first radio signal.

In one embodiment, the first node is a base station, an identifier of a target receiver of the first radio signal is an RNTI.

In one embodiment, the CRC bit block of the first bit sub-block is an output after the first bit sub-block is subjected to a CRC cyclic generator polynomial. A polynomial consisting of the first bit sub-block and the CRC bit block of the first bit sub-block can be divided by the CRC cyclic generator polynomial on GF(2), namely, the polynomial consisting of the first bit sub-block and the CRC bit block of the first bit sub-block yields a remainder equal to 0 when divided by the CRC Cyclic Generator Polynomial.

In one embodiment, a length of the second bit sub-block is one of 24, 16 and 8.

In one embodiment, the length of the second bit sub-block is less than 8.

In one embodiment, bits in the second bit sub-block are not related to the bits in the second bit block.

In one embodiment, part of bits in the first bit sub-block are used to generate the bits in the second bit block, the other part of the bits in the first bit sub-block are not related to the bits in the second bit block.

Specifically, according to one aspect of the present disclosure, wherein a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, the above method is advantageous in that Unequal Error Protection can be offered to the first bit set and the second bit set, so that important bits can be transmitted on sub-channels with higher reliability, thus improving the transmission quality of transmission of the first radio signal.

In one embodiment, there does not exist a bit common to the first bit set and the second bit set.

In one embodiment, any bit in the first bit block belongs to one of the first bit set and the second bit set, any bit in the second bit block belongs to one of the first bit set and the second bit set.

In one embodiment, the input to the channel coding includes all bits in the first bit block, all bits in the second bit block and all bits in a third bit block. Values of all bits in the third bit block are pre-set. A channel capacity of a sub-channel mapped by any bit in the third bit block is smaller than a channel capacity of a sub-channel mapped by any bit in the second bit set.

In one embodiment, the part of the bits in the first bit block and the other part of the bits in the first bit block constitute the first bit block.

In one embodiment, the other part of the bits in the first bit block are used to generate the bits in the second bit block, the bits in the second bit block are not related to the part of the bits in the first bit block.

In one embodiment, a channel capacity of a sub-channel occupied by any bit of the other part of the bits in the first bit block is greater than a channel capacity of a sub-channel occupied by any bit in the second bit block.

Specifically, according to one aspect of the present disclosure, wherein a CRC bit block of the first bit block is used to generate the second bit block.

In one embodiment, the second bit block is a CRC bit block of the first bit block.

In one embodiment, the second bit block is a bit block after a CRC bit block of the first bit block is subjected to scrambling.

In one embodiment, a scrambling sequence employed in the scrambling is related to an identifier of the first node.

In one embodiment, the first node is a UE, an identifier of the first node is an RNTI.

In one embodiment, the first node is a base station, an identifier of the first node is a PCI.

In one embodiment, a scrambling sequence employed in the scrambling is related to an identifier of a target receiver of the first radio signal.

In one embodiment, the first node is a base station, an identifier of a target receiver of the first radio signal is an RNTI.

In one embodiment, the CRC bit block of the first bit block is an output after the first bit block is subjected to a CRC cyclic generator polynomial. A polynomial consisting of the first bit block and the CRC bit block of the first bit block can be divided by the CRC cyclic generator polynomial on GF(2), namely, the polynomial consisting of the first bit block and the CRC bit block of the first bit block yields a remainder equal to 0 when divided by the CRC Cyclic Generator Polynomial.

In one embodiment, the other part of the bits in the first bit block are used to generate the second bit block.

In one embodiment, the second bit block is a CRC bit block of the other part of the bits in the first bit block.

In one embodiment, the second bit block is a bit block after a CRC bit block of the other part of the bits in the first bit block is subjected to scrambling.

In one embodiment, the other part of the bits in the first bit block are a subset of the first bit sub-block.

In one subembodiment of the above embodiment, bits in the first bit sub-block not belonging to the other part of bits in the first bit block are unrelated to bits in the second bit block.

Specifically, according to one aspect of the present disclosure, wherein the first node is a base station, the first bit block comprises downlink control information (DCI); or the first node is a UE, the first bit block comprises uplink control information (UCI).

In one embodiment, the DCI indicates at least one of corresponding statistics, which are time domain resources occupied, frequency domain resources occupied, a Modulation and Coding Scheme (MCS), a Redundancy Version (RV), a New Data Indicator (NDI), and a Hybrid Automatic Repeat reQuest (HARQ) process number.

In one embodiment, the UCI indicates at least one of HARQ-Acknowledgement (HARQ-ACK), Channel State Information (CSI), a Scheduling Request (SR), or a CSI-RS resource indication (CRI).

The present disclosure discloses a method in a second node for wireless communication, comprising:
receiving a first radio signal;
performing channel decoding; and
recovering a first bit block;
wherein channel coding corresponding to the channel decoding is based on a polar code; bits in the first bit block are used to generate bits in a second bit block; the bits in the first bit block and the bits in the second bit block are both used for an input to the channel coding, an output after the channel coding is used to generate the first radio signal; for the channel coding, a sub-channel occupied by a target first type bit is related to at least one of a number of bits in the second bit block related to the target first type bit, or numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer.

In one embodiment, the second node is a base station, the first node is a UE.

In one embodiment, the second node is a UE, the first node is a base station.

In one embodiment, an output after the channel decoding is used to recover the first bit block.

Specifically, according to one aspect of the present disclosure, wherein the higher the number of the bits in the second bit block related to the target first type bit is, the lower a channel capacity corresponding to the sub-channel occupied by the target first type bit will be.

Specifically, according to one aspect of the present disclosure, wherein the less a sum of the numbers of the bits in the K first type bit sets is, the lower a channel capacity corresponding to the sub-channel occupied by the target first type bit will be.

Specifically, according to one aspect of the present disclosure, wherein the greater a sum of reciprocals of the numbers of the bits in the K first type bit sets is, the lower a channel capacity corresponding to the sub-channel occupied by the target first type bit will be.

Specifically, according to one aspect of the present disclosure, wherein the first bit block comprises a first bit sub-block and a second bit sub-block, a CRC bit block of the first bit sub-block is used to generate the second bit sub-block.

Specifically, according to one aspect of the present disclosure, wherein a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

Specifically, according to one aspect of the present disclosure, wherein the channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P; reference values in the P reference values that correspond to the bits in the second bit block are used for pruning in the channel decoding; reference values in the P reference values that correspond to bits in the second bit sub-block are used to determine whether the first bit block is correctly received; the P is a positive integer greater than 1.

In one embodiment, the above method is advantageous in that the bits in the second bit block can be used to improve decoding accuracy in the channel decoding and to reduce complexity of decoding; the bits in the second bit sub-block can be used to realize traditional CRC functions, which is to determine whether the first bit block is correctly received, and to transmit an identifier of the first node or an identifier of a receiver of the first radio signal. Therefore, both pruning and traditional CRC functions will be realized.

In one embodiment, the P reference values are (received) bits recovered from corresponding (transmitted) bits.

In one embodiment, the P reference values are (received) soft bits recovered from corresponding (transmitted) bits.

In one embodiment, the P reference values are Log Likelihood Ratios (LLRs) estimated for corresponding (transmitted) bits.

In one embodiment, the pruning is used to reduce surviving search paths in the channel decoding based on Viterbi principle.

In one embodiment, a given reference value is a reference value in the P reference values used for pruning. For the given reference value, bits corresponding to a pruned search path are related to a given second type bit, the given second type bit is a bit in the second bit block corresponding to the given reference value.

In one subembodiment of the above embodiment, for the given reference value, bits corresponding to a pruned search path are used to generate the given second type bit.

In one subembodiment of the above embodiment, for the given reference value, a sum of bits corresponding to a pruned search path is subjected to mod2 before acquiring the given second type bit.

In one subembodiment of the above embodiment, for the given reference value, a sum of bits corresponding to a pruned search path is subjected to mod2 and then to Xor operation with a corresponding bit in a scrambling sequence before acquiring the given second type bit.

In one embodiment, reference values in the P reference values that correspond to bits in the second bit sub-block are used to indicate an identifier of a target receiver of the first radio signal.

In one embodiment, reference values in the P reference values that correspond to bits in the second bit sub-block are used to indicate an identifier of the first node.

In one embodiment, reference values in the P reference values that correspond to bits in the second bit sub-block and reference values in the P reference values that correspond to bits in the first bit sub-block collectively pass CRC check, if the check result turns out to be correct, it is then determined that the first bit block is correctly recovered; otherwise, it is determined that the first bit block is not recovered correctly.

Specifically, according to one aspect of the present disclosure, wherein a CRC bit block of the first bit block is used to generate the second bit block.

Specifically, according to one aspect of the present disclosure, wherein the second node is a UE, the first bit block comprises DCI; or the second node is a base station, the first bit block comprises UCI.

The present disclosure discloses a device in a first node for wireless communication, comprising:
 a first processor, generating a first bit block;
 a second processor, performing channel coding; and
 a first transmitter, transmitting a first radio signal;
 wherein bits in the first bit block are used to generate bits in a second bit block; the bits in the first bit block and the bits in the second bit block are both used for an input to the channel coding, an output after the channel coding is used to generate the first radio signal; the channel coding is based on a polar code; for the channel coding, a sub-channel occupied by a target first type bit is related to at least one of a number of bits in the second bit block related to the target first type bit, or numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer.

In one embodiment, the device in the above first node is characterized in that the higher the number of the bits in the second bit block related to the target first type bit is, the lower a channel capacity corresponding to the sub-channel occupied by the target first type bit will be.

In one embodiment, the device in the above first node is characterized in that the less a sum of the numbers of the bits in the K first type bit sets is, the lower a channel capacity corresponding to the sub-channel occupied by the target first type bit will be.

In one embodiment, the device in the above first node is characterized in that the greater a sum of reciprocals of the numbers of the bits in the K first type bit sets is, the lower a channel capacity corresponding to the sub-channel occupied by the target first type bit will be.

In one embodiment, the device in the above first node is characterized in that the first bit block comprises a first bit sub-block and a second bit sub-block, a CRC bit block of the first bit sub-block is used to generate the second bit sub-block.

In one embodiment, the device in the above first node is characterized in that a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, the device in the above first node is characterized in that a CRC bit block of the first bit block is used to generate the second bit block.

In one embodiment, the device in the above first node is characterized in that the first node is a base station, the first bit block comprises DCI; or the first node is a UE, the first bit block comprises UCI.

The present disclosure discloses a device in a second node for wireless communication, comprising:
 a first receiver, receiving a first radio signal;
 a third processor, performing channel decoding; and
 a fourth processor, recovering a first bit block;
 wherein channel coding corresponding to the channel decoding is based on a polar code; bits in the first bit block are used to generate bits in a second bit block; the bits in the first bit block and the bits in the second bit block are both used for an input to the channel coding, an output after the channel coding is used to generate the first radio signal; for the channel coding, a sub-channel occupied by a target first type bit is related to at least one of a number of bits in the second bit block related to the target first type bit, or numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer.

In one embodiment, the device in the second node is characterized in that an output after the channel decoding is used to recover the first bit block.

In one embodiment, the device in the second node is characterized in that the higher the number of the bits in the second bit block related to the target first type bit is, the lower a channel capacity corresponding to the sub-channel occupied by the target first type bit will be.

In one embodiment, the device in the second node is characterized in that the less a sum of the numbers of the bits in the K first type bit sets is, the lower a channel capacity corresponding to the sub-channel occupied by the target first type bit will be.

In one embodiment, the device in the second node is characterized in that the greater a sum of reciprocals of the numbers of the bits in the K first type bit sets is, the lower a channel capacity corresponding to the sub-channel occupied by the target first type bit will be.

In one embodiment, the device in the second node is characterized in that the first bit block comprises a first bit sub-block and a second bit sub-block, a CRC bit block of the first bit sub-block is used to generate the second bit sub-block.

In one embodiment, the device in the second node is characterized in that a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, the device in the second node is characterized in that the channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P; reference values in the P reference values that correspond to the bits in the second bit block are used for pruning in the channel decoding; reference values in the P reference values that correspond to bits in the second bit sub-block are used to determine whether the first bit block is correctly received; the P is a positive integer greater than 1.

In one embodiment, the method in the above second node is characterized in that a CRC bit block of the first bit block is used to generate the second bit block.

In one embodiment, the method in the above second node is characterized in that the second node is a UE, the first bit block comprises DCI; or the second node is a base station, the first bit block comprises UCI.

In one embodiment, the present disclosure has the following advantages over conventional schemes:

CRC or one of other block codes is utilized as an outer code for a polar code, thus enhancing the decoding performance of the polar code;

the redundancy of an information bit in an outer code is determined based on the transmission reliability of a sub-channel mapped by the information bit, so that Unequal Error Protection can be provided to information bits on different sub-channels, namely, an information bit transmitted on a sub-channel with weaker reliability can be subjected to stronger error protection in an outer code to improve transmission reliability thereof;

the check bit of an outer code is used in the decoding process for pruning, so as to reduce complexity of decoding;

traditional CRC functions are maintained, i.e., error check and target receiver identification.

BRIEF DESCRIPTION OF THE DRAWINGS

Other features, objects and advantages of the present disclosure will become more apparent from the detailed description of non-restrictive embodiments taken in conjunction with the following drawings.

DESCRIPTION OF THE EMBODIMENTS

Embodiment 1

Figure 1:
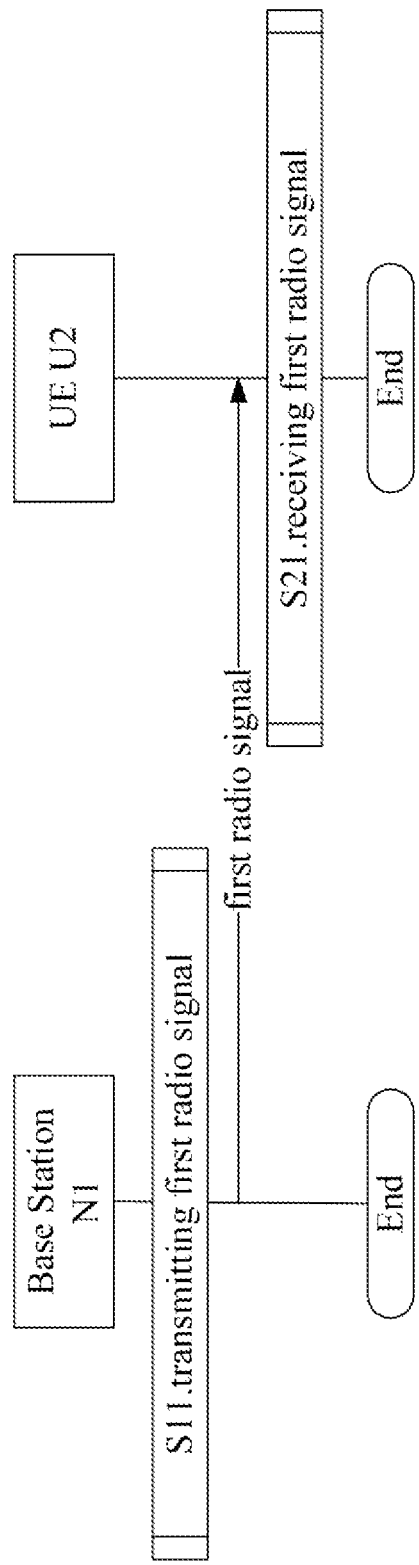
FIG. 1 illustrates a flowchart of wireless transmission according to one embodiment of the present disclosure.

Embodiment 1 illustrates a flowchart of wireless transmission, as shown in FIG. 1. In FIG. 1, a base station N1 is a maintenance base station for a serving cell of a UE U2.

The N1 transmits a first radio signal in step S11.

The U2 receives a first radio signal in step S12.

In Embodiment 1, bits in a first bit block are used by the N1 to generate bits in a second bit block. The bits in the first bit block and the bits in the second bit block are both used by the N1 for an input to channel coding, the input to the channel coding is used by the N1 to generate the first radio signal. The channel coding is based on a polar code; for the channel coding, a sub-channel occupied by a target first type bit is related to at least one of a number of bits in the second bit block related to the target first type bit, or numbers of bits in K first type bit sets. The target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer. The first radio signal is used by the U2 to generate an input to channel decoding, channel coding corresponding to the channel decoding is based on a polar code. An output after the channel decoding is used by the U2 to recover the first bit block.

In one embodiment, the sub-channel refers to a position in an input bit sequence of Arikan polar encoder.

In one subembodiment of the above embodiment, an output after the input bit sequence is multiplied by a polar coding matrix is the output after the channel coding. The polar coding matrix is acquired as a product of a bit reversal permutation matrix and a first matrix, the first matrix is the n-th Kronecker power of a kernel matrix, the n is the logarithm of a length of the input bit sequence with base 2, the kernel matrix is a matrix with 2 rows and 2 columns, wherein two elements in a first row are 1 and 0, respectively, and other two elements in a second row are both 1.

In one embodiment, the phrase that the sub-channel occupied by the target first type bit is related to at least one of a number of bits in the second bit block related to the target first type bit, or numbers of bits in K first type bit sets refers to: a channel capacity of a sub-channel occupied by the target bit is related to at least one of a number of bits in the second bit block related to the target bit or numbers of bits in K first type bits sets.

In one embodiment, the channel capacity of one sub-channel is: an upper bound of information rate of reliable transmission on the one sub-channel.

In one embodiment, part of the bits in the first bit block are not related to the bits in the second bit block.

In one embodiment, the first bit block is generated on a physical layer of the N1. The N1 generates the first bit block based on a result of scheduling.

In one embodiment, the input to the channel coding includes all bits in the first bit block, all bits in the second bit block and all bits in a third bit block. Values of all bits in the third bit block are pre-set.

In one subembodiment of the above embodiment, all the bits in the third bit block are 0.

In one subembodiment of the above embodiment, the bits in the third bit block are related to an identifier of the U2.

In one subembodiment of the above embodiment, an identifier of the U2 is used to generate the bits in the third bit block.

In one subembodiment of the above embodiment, an identifier of the U2 is an RNTI.

In one embodiment, the first radio signal is an output after the output of the channel coding is sequentially subjected to Channel Coding, Scrambling, a Modulation Mapper, a Layer Mapper, Precoding, a Resource Element Mapper and broadband symbol generation.

In one embodiment, the broadband symbol is an OFDM symbol.

In one embodiment, the broadband symbol is an FBMC symbol.

In one embodiment, the second bit block is not related to bits other than the first bit block.

In one embodiment, the higher the number of the bits in the second bit block related to the target first type bit is, the lower a channel capacity corresponding to the sub-channel occupied by the target first type bit will be.

In one embodiment, the less a sum of the numbers of the bits in the K first type bit sets is, the lower a channel capacity corresponding to the sub-channel occupied by the target first type bit will be.

In one embodiment, the greater a sum of reciprocals of the numbers of the bits in the K first type bit sets is, the lower a channel capacity corresponding to the sub-channel occupied by the target first type bit will be.

In one embodiment, the first bit block comprises a first bit sub-block and a second bit sub-block, a CRC bit block of the first bit sub-block is used to generate the second bit sub-block.

In one embodiment, a channel capacity of a sub-channel mapped by any bit in a first bit set is greater than a channel capacity of a sub-channel mapped by any bit in a second bit set. The bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, a CRC bit block of the first bit block is used to generate the second bit block.

In one embodiment, the first bit block comprises DCI.

In one subembodiment of the above embodiment, the DCI indicates at least one of corresponding statistics, which are time domain resources occupied, frequency domain resources occupied, an MCS, an RV, an NDI, and a HARQ process number.

In one embodiment, the channel decoding is used by the U2 to determine P reference values, the P reference values respectively correspond to bits in a target bit group, the target bit group consists of the bits in the first bit block and the bits in the second bit block, a sum of a number of the bits in the first bit block and a number of the bits in the second bit block is the P. Reference values in the P reference values that correspond to the bits in the second bit block are used for pruning in the channel decoding. Reference values in the P reference values that correspond to bits in the second bit sub-block are used to determine whether the first bit block is correctly received. The P is a positive integer greater than 1.

Embodiment 2

Figure 2:
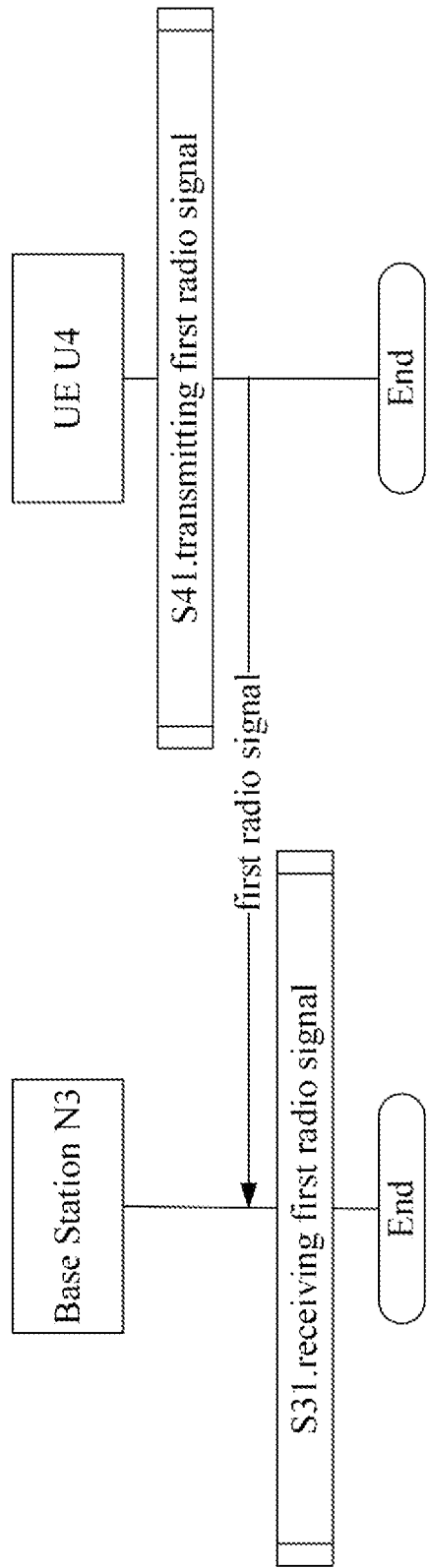
FIG. 2 illustrates a flowchart of wireless transmission according to another embodiment of the present disclosure.

Embodiment 2 illustrates a flowchart of wireless transmission, as shown in FIG. 2. In FIG. 2, a base station N3 is a maintenance base station for a serving cell of a UE U4. The N3 receives a first radio signal in step S31.

The U4 transmits a first radio signal in step S41.

In Embodiment 2, bits in a first bit block are used by the U4 to generate bits in a second bit block. The bits in the first bit block and the bits in the second bit block are both used by the U4 for an input to channel coding, the input to the channel coding is used by the U4 to generate the first radio signal. The channel coding is based on a polar code; for the channel coding, a sub-channel occupied by a target first type bit is related to at least one of a number of bits in the second bit block related to the target first type bit, or numbers of bits in K first type bit sets. The target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer. The first radio signal is used by the N3 to generate an input to channel decoding, channel coding corresponding to the channel decoding is based on a polar code. An output after the channel decoding is used by the N3 to recover the first bit block.

In one embodiment, the first bit block is generated on a physical layer of the U4.

In one embodiment, the U4 generates the first bit block based on a result of scheduling from the N3.

In one embodiment, the first radio signal is an output after the output of the channel coding is sequentially subjected to scrambling, a Modulation Mapper, a Layer Mapper, a transform precoder, Precoding, a Resource Element Mapper and broadband symbol generation.

In one embodiment, the first bit block comprises UCI.

In one subembodiment of the above embodiment, the UCI indicates at least one of HARQ-ACK, CSI, an SR, or a CRI.

Embodiment 3

Figure 3:
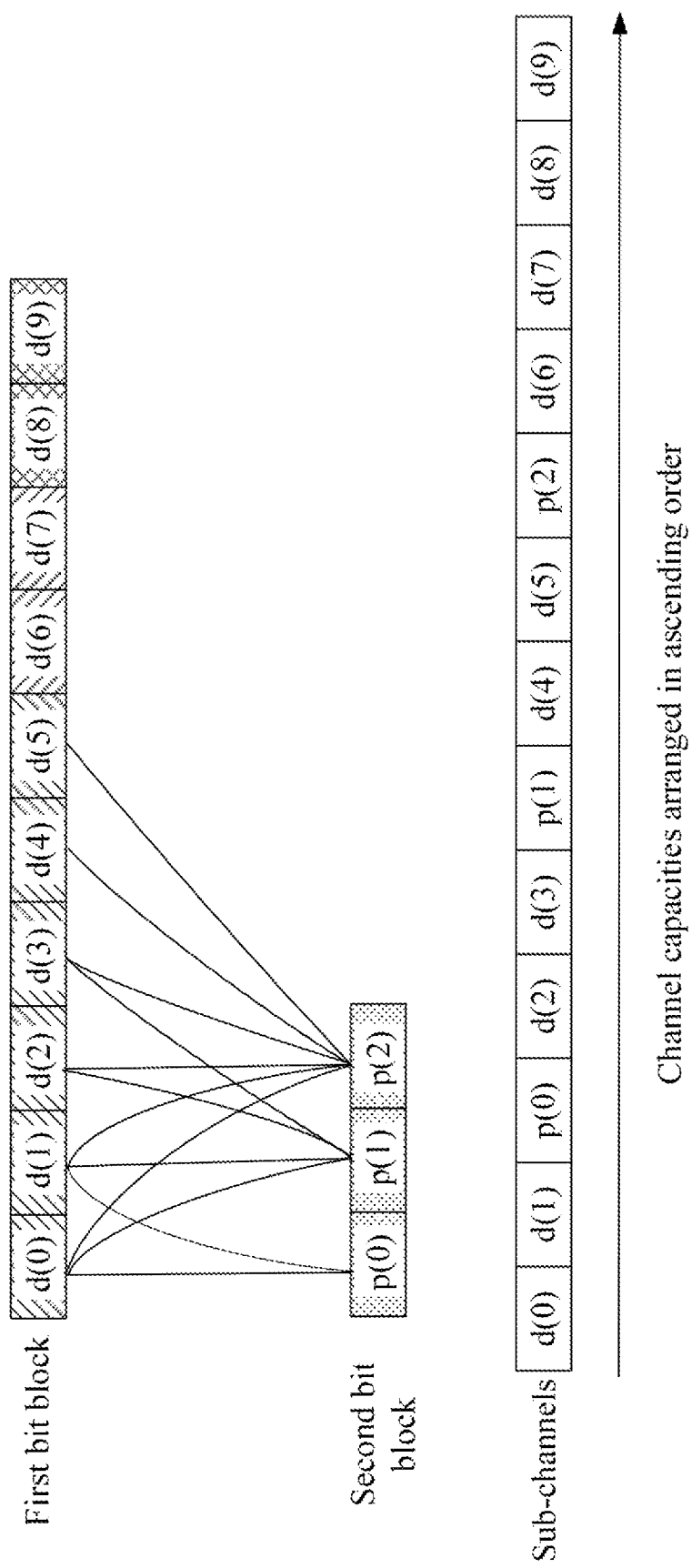
FIG. 3 illustrates a schematic diagram of a mapping relationship between a first bit block and a second bit block on a sub-channel according to one embodiment of the present disclosure.

Embodiment 3 illustrates a schematic diagram of a mapping relationship between a first bit block and a second bit block on a sub-channel, as shown in FIG. 3.

In Embodiment 3, bits in the first bit block are used to generate bits in the second bit block. The bits in the first bit block and the bits in the second bit block are both used for an input to the channel coding, an output after the channel coding is used to generate the first radio signal. The channel coding is based on a polar code. For the channel coding, the higher the number of the bits in the second bit block related to the target first type bit is, the lower a channel capacity corresponding to the sub-channel occupied by the target first type bit will be. The target first type bit belongs to the first bit block.

In FIG. 3, the first bit block consists of 10 bits, a bit in the first bit block is represented by $d(i)$, the i is an integer greater than or equal to 0 and less than 10; the second bits block consists of 3 bits, a bit in the second bit block is represented by $p(j)$, the j is an integer greater than or equal to 0 and less than 3. The target first type bit is connected to (a) bit(s) in the second bit block related to the target first type bit via (a) solid line(s).

In one embodiment, for any bit in the second bit block, the any bit is equal to a sum of a positive integer number of bit(s) in the first bit block subjected to mod2. For example, in FIG. 3, p(0) is equal to a sum of d(0) and d(1) subjected to mod2.

In one embodiment, for any bit in the second bit block, the any bit is acquired after a sum of a positive integer number of bit(s) in the first bit block is subjected to mod2 and then to Xor operation with a corresponding bit in a scrambling sequence. For example, in FIG. 3, p(0) is acquired after a sum of d(0) and d(1) is subjected to mod2 and then to Xor operation with a corresponding bit in a scrambling sequence.

In one embodiment, the second bit block is not related to bits other than the first bit block.

In one embodiment, a channel capacity of a sub-channel occupied by a first given bit is smaller than a channel capacity of a sub-channel occupied by a second given bit, the first given bit and the second given bit both belong to the first bit block, the number of bits in the second bit block related to the first given bit is greater than the number of bits in the second bit block related to the second given bit. For example, in FIG. 3, d(0) is related to p(0), p(1) and p(2), d(2) is related to p(1) and p(2), d(4) is related to p(2); a channel capacity of a sub-channel occupied by d(0) is smaller than a channel capacity of a sub-channel occupied by d(2), and a channel capacity of a sub-channel occupied by d(2) is smaller than a channel capacity of a sub-channel occupied by d(4).

In one embodiment, part of the bits in the first bit block are unrelated to the bits in the second bit block. For example, in FIG. 3, d(6), d(7), d(8) and d(9) (i.e., boxes filled with back-slashes and boxes filled with crosses) are not related to the bits in the second bit block.

In one embodiment, the first bit block comprises a first bit sub-block and a second bit sub-block, a CRC bit block of the first bit sub-block is used to generate the second bit sub-block. In FIG. 3, boxes filled with slashes and with back-slashes represent the first bit sub-block while boxes filled with crosses represent the second bit sub-block.

In one embodiment, bits in the second bit sub-block are not related to the bits in the second bit block. For example, in FIG. 3, d(8) and d(9) (i.e., boxes filled with crosses) are not related to the bits in the second bit block.

In one embodiment, part of bits in the first bit sub-block are used to generate the bits in the second bit block, the other part of the bits in the first bit sub-block are not related to the bits in the second bit block. In FIG. 3, boxes filled with slashes represent the bits in the first bit sub-block used to generate the second bit block, boxes filled with back-slashes represent the bits in the first bit sub-block not related to the bits in the second bit block.

In one embodiment, a channel capacity of a sub-channel mapped by any bit in a first bit set is greater than a channel capacity of a sub-channel mapped by any bit in a second bit set. Part of the bits in the first bit block belong to the first bit set, the other part of the bits in the first bit block and the bits in the second bit block belong to the second bit set. For example, in FIG. 3, d(0), d(1), d(2), d(3), d(4), d(5), p(0), p(1) and p(2) (i.e., boxes filled with slashes and the bits in the second bit block) belong to the second bit set, and d(6), d(7), d(8) and d(9) (i.e., boxes filled with back-slashes and boxes filled with crosses) belong to the first bit set.

In one subembodiment of the above embodiment, there does not exist a bit common to the first bit set and the second bit set.

In one subembodiment of the above embodiment, any bit in the first bit block belongs to one of the first bit set or a second bit set, any bit in the second bit block belongs to one of the first bit set or a second bit set.

In one subembodiment of the above embodiment, the part of the bits in the first bit block and the other part of the bits in the first bit block constitute the first bit block.

In one subembodiment of the above embodiment, the other part of the bits in the first bit block are used to generate the bits in the second bit block, the part of the bits in the first bit block are not related to the bits in the second bit block. For example, in FIG. 3, d(0), d(1), d(2), d(3), d(4) and d(5) (i.e., boxes filled with slashes) are used to generate the bits in the second bit block, while d(6), d(7), d(8) and d(9) (i.e., boxes filled with back-slashes and boxes filled with crosses) are not related to the bits in the second bit block.

Embodiment 4

Figure 4:
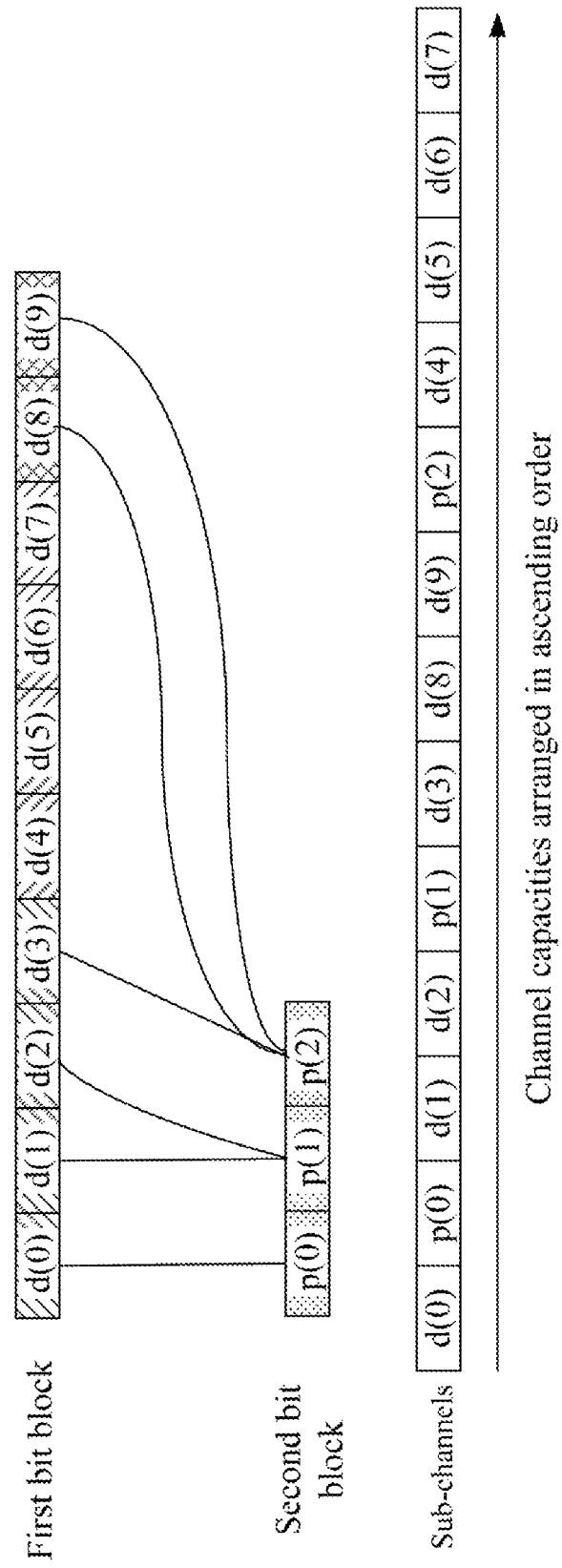
FIG. 4 illustrates a schematic diagram of a mapping relationship between a first bit block and a second bit block on a sub-channel according to another embodiment of the present disclosure.

Embodiment 4 illustrates a schematic diagram of a mapping relationship between a first bit block and a second bit block on a sub-channel, as shown in FIG. 4.

In Embodiment 4, bits in the first bit block are used to generate bits in the second bit block. The bits in the first bit block and the bits in the second bit block are both used for an input to the channel coding, an output after the channel coding is used to generate the first radio signal. The channel coding is based on a polar code. For the channel coding, the less a sum of the numbers of the bits in the K first type bit sets is, the lower a channel capacity corresponding to the sub-channel occupied by the target first type bit will be. The target first type bit belongs to the first bit block. The K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer.

In FIG. 4, the first bit block consists of 10 bits, a bit in the first bit block is represented by d(i), the i is an integer greater than or equal to 0 and less than 10; the second bits block consists of 3 bits, a bit in the second bit block is represented by p(j), the j is an integer greater than or equal to 0 and less than 3. The target first type bit is connected to (a) bit(s) in the second bit block related to the target first type bit via (a) solid line(s).

In one embodiment, for any bit in the second bit block, the any bit is equal to a sum of a positive integer number of bit(s) in the first bit block subjected to mod2. For example, in FIG. 4, p(0) is equal to d(0) subjected to mod2; in FIG. 4, p(1) is equal to a sum of d(1) and d(2) subjected to mod2.

In one embodiment, for any bit in the second bit block, the any bit is acquired after a sum of a positive integer number of bit(s) in the first bit block is subjected to mod2 and then to Xor operation with a corresponding bit in a scrambling sequence. For example, in FIG. 4, p(0) is acquired after d(0) is subjected to mod2 and then to Xor operation with a corresponding bit in a scrambling sequence; in FIG. 4, p(1) is acquired after a sum of d(1) and d(2) is subjected to mod2 and then to Xor operation with a corresponding bit in a scrambling sequence.

In one embodiment, the second bit block is not related to bits other than the first bit block.

In one embodiment, the K is equal to 1.

In one embodiment, the K is greater than 1.

In one embodiment, the K remains unchanged.

In one embodiment, a sum of numbers of bits in K1 first type bit sets is less than a sum of numbers of bits in K2 first type bit sets. The K1 first type bit sets respectively correspond to the K1 second type bits, the K1 second type bits are all bits in the second bit block related to a first given bit. The K2 first bit sets respectively correspond to K2 second type bits; the K2 second type bits are all bits in the second bit block related to a second given bit. The K1 and the K2 are positive integers, respectively. A channel capacity of a sub-channel occupied by the first given bit is smaller than a channel capacity of a sub-channel occupied by the second given bit. The first given bit and the second given bit both belong to the first bit block. For example, in FIG. 4, the first given bit is d(0), the second given bit is d(1), the K1 first type bit sets are d(0), the K1 is 1; the K2 first type bit sets are d(1) and d(2), the K2 is 1. The sum of numbers of bits in K1 first type bit sets is 1, and the sum of numbers of bits in K2 first type bit sets is 2, a channel capacity of a sub-channel occupied by d(0) is smaller than a channel capacity of a sub-channel occupied by d(1).

In one embodiment, the K1 is equal to the K2.

In one embodiment, part of the bits in the first bit block are unrelated to the bits in the second bit block. For example, in FIG. 4, d(4), d(5), d(6) and d(7) (i.e., boxes filled with back-slashes) are not related to the bits in the second bit block.

In one embodiment, the first bit block comprises a first bit sub-block and a second bit sub-block, a CRC bit block of the first bit sub-block is used to generate the second bit sub-block. In FIG. 4, boxes filled with slashes and with back-slashes represent the first bit sub-block while boxes filled with crosses represent the second bit sub-block.

In one embodiment, part of bits in the first bit sub-block are used to generate the bits in the second bit block, the other part of the bits in the first bit sub-block are not related to the bits in the second bit block. In FIG. 4, boxes filled with slashes and with crosses represent the bits in the first bit block used to generate the second bit block, boxes filled with back-slashes represent the bits in the first bit block not related to the bits in the second bit block.

In one embodiment, a channel capacity of a sub-channel mapped by any bit in a first bit set is greater than a channel capacity of a sub-channel mapped by any bit in a second bit set. Part of the bits in the first bit block belong to the first bit set, the other part of the bits in the first bit block and the bits in the second bit block belong to the second bit set. For example, in FIG. 4, d(0), d(1), d(2), d(3), d(8), d(9), p(0), p(1) and p(2) (i.e., boxes filled with slashes and boxes filled with crosses, and the bits in the second bit block) belong to the second bit set, and d(4), d(5), d(6) and d(7) (i.e., boxes filled with back-slashes) belong to the first bit set.

In one subembodiment of the above embodiment, there does not exist a bit common to the first bit set and the second bit set.

In one subembodiment of the above embodiment, any bit in the first bit block belongs to one of the first bit set or a second bit set, any bit in the second bit block belongs to one of the first bit set or a second bit set.

In one subembodiment of the above embodiment, the part of the bits in the first bit block and the other part of the bits in the first bit block constitute the first bit block.

In one subembodiment of the above embodiment, the other part of the bits in the first bit block are used to generate the bits in the second bit block, the part of the bits in the first bit block are not related to the bits in the second bit block. For example, in FIG. 4, d(0), d(1), d(2), d(3), d(8) and d(9) (i.e., boxes filled with slashes and boxes filled with crosses) are used to generate the bits in the second bit block, while d(4), d(5), d(6) and d(7) (i.e., boxes filled with back-slashes) are not related to the bits in the second bit block.

Embodiment 5

Figure 5:
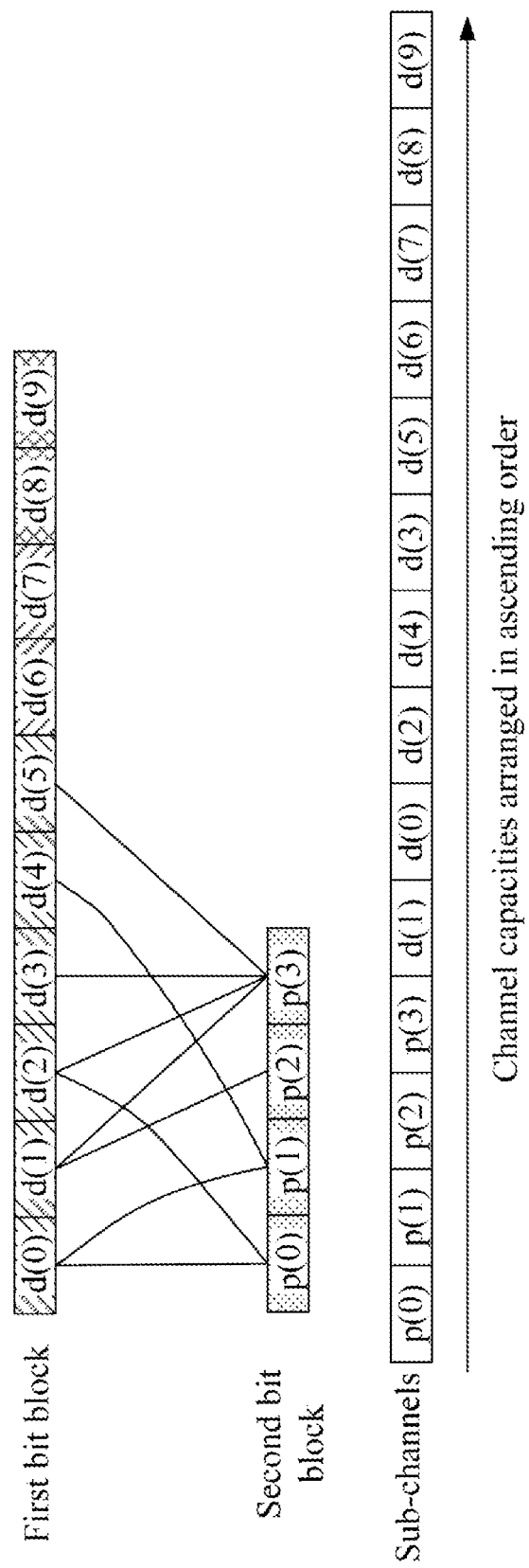
FIG. 5 illustrates a schematic diagram of a mapping relationship between a first bit block and a second bit block on a sub-channel according to another embodiment of the present disclosure.

Embodiment 5 illustrates a schematic diagram of a mapping relationship between a first bit block and a second bit block on a sub-channel, as shown in FIG. 5.

In Embodiment 5, bits in the first bit block are used to generate bits in the second bit block. The bits in the first bit block and the bits in the second bit block are both used for an input to the channel coding, an output after the channel coding is used to generate the first radio signal. The channel coding is based on a polar code. For the channel coding, the greater a sum of reciprocals of the numbers of the bits in the K first type bit sets is, the lower a channel capacity corresponding to the sub-channel occupied by the target first type bit will be. The target first type bit belongs to the first bit block. The K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer.

In FIG. 5, the first bit block consists of 10 bits, a bit in the first bit block is represented by d(i), the i is an integer greater than or equal to 0 and less than 10; the second bits block consists of 4 bits, a bit in the second bit block is represented by p(j), the j is an integer greater than or equal to 0 and less than 4. The target first type bit is connected to (a) bit(s) in the second bit block related to the target first type bit via (a) solid line(s).

In one embodiment, for any bit in the second bit block, the any bit is equal to a sum of a positive integer number of bit(s) in the first bit block subjected to mod2. For example, in FIG. 5, p(0) is equal to a sum of d(0) and d(2) subjected to mod2.

In one embodiment, for any bit in the second bit block, the any bit is acquired after a sum of a positive integer number of bit(s) in the first bit block is subjected to mod2 and then to Xor operation with a corresponding bit in a scrambling sequence. For example, in FIG. 5, p(0) is acquired after a sum of d(0) and d(2) is subjected to mod2 and then to Xor operation with a corresponding bit in a scrambling sequence.

In one embodiment, the second bit block is not related to bits other than the first bit block.

In one embodiment, the K is equal to 1.

In one embodiment, the K is greater than 1.

In one embodiment, the K remains unchanged.

In one embodiment, a sum of reciprocals of numbers of bits in K1 first type bit sets is greater than a sum of reciprocals of numbers of bits in K2 first type bit sets. The K1 first type bit sets respectively correspond to the K1 second type bits, the K1 second type bits are all bits in the second bit block related to a first given bit. The K2 first bit sets respectively correspond to K2 second type bits; the K2 second type bits are all bits in the second bit block related to a second given bit. The K1 and the K2 are positive integers, respectively. A channel capacity of a sub-channel occupied by the first given bit is smaller than a channel capacity of a sub-channel occupied by the second given bit.

The first given bit and the second given bit both belong to the first bit block. For example, in FIG. 5, the first given bit is d(0), the second given bit is d(1), the K1 first type bit sets are a collection of d(0) and d(2) and a collection of d(0) and d(4), the K1 is 2; the K2 first type bit sets are d(1) and a collection of d(1), d(2), d(3) and d(5), the K2 is 2. The sum of reciprocals of the numbers of bits in K1 first type bit sets is 1, and the sum of reciprocals of the numbers of bits in K2 first type bit sets is 1.25, a channel capacity of a sub-channel occupied by d(0) is greater than a channel capacity of a sub-channel occupied by d(1).

In one embodiment, the K1 is equal to the K2.

In one embodiment, part of the bits in the first bit block are not related to the bits in the second bit block. For example, in FIG. 5, d(6), d(7), d(8) and d(9) (i.e., boxes filled with back-slashes and boxes filled with crosses) are not related to the bits in the second bit block.

In one embodiment, the first bit block comprises a first bit sub-block and a second bit sub-block, a CRC bit block of the first bit sub-block is used to generate the second bit sub-block. In FIG. 5, boxes filled with slashes and with back-slashes represent the first bit sub-block while boxes filled with crosses represent the second bit sub-block.

In one embodiment, the bits in the second bit sub-block are not related to the bits in the second bit block. For example, in FIG. 5, d(8) and d(9) (i.e., boxes filled with crosses) are not related to the bits in the second bit block.

In one embodiment, part of bits in the first bit sub-block are used to generate the bits in the second bit block, the other part of the bits in the first bit sub-block are not related to the bits in the second bit block. In FIG. 5, boxes filled with slashes represent the bits in the first bit sub-block used to generate the second bit block, boxes filled with back-slashes represent the bits in the first bit sub-block not related to the bits in the second bit block.

In one embodiment, a channel capacity of a sub-channel mapped by any bit in a first bit set is greater than a channel capacity of a sub-channel mapped by any bit in a second bit set. Part of the bits in the first bit block belong to the first bit set, the other part of the bits in the first bit block and the bits in the second bit block belong to the second bit set. For example, in FIG. 5, d(0), d(1), d(2), d(3), d(4), d(5), p(0), p(1), p(2) and p(3) (i.e., boxes filled with slashes and the bits in the second bit block) belong to the second bit set, and d(6), d(7), d(8) and d(9) (i.e., boxes filled with back-slashes and boxes filled with crosses) belong to the first bit set.

In one subembodiment of the above embodiment, there does not exist a bit common to the first bit set and the second bit set.

In one subembodiment of the above embodiment, any bit in the first bit block belongs to one of the first bit set or a second bit set, any bit in the second bit block belongs to one of the first bit set or a second bit set.

In one subembodiment of the above embodiment, the part of the bits in the first bit block and the other part of the bits in the first bit block constitute the first bit block.

In one subembodiment of the above embodiment, the other part of the bits in the first bit block are used to generate the bits in the second bit block, the part of the bits in the first bit block are not related to the bits in the second bit block. For example, in FIG. 5, d(0), d(1), d(2), d(3), d(4) and d(5) (i.e., boxes filled with slashes) are used to generate the bits in the second bit block, while d(6), d(7), d(8) and d(9) (i.e., boxes filled with back-slashes and boxes filled with crosses) are not related to the bits in the second bit block.

In one embodiment, the bits in the first bit block belong to the first bit set, the bits in the second bit block belongs to the second bit set. For example, in FIG. 5, d(0), d(1), d(2), d(3), d(4), d(5), d(6), d(7), d(8) and d(9) belong to the first bit set, p(0), p(1), p(2) and p(3) belong to the second bit set.

Embodiment 6

Figure 6:
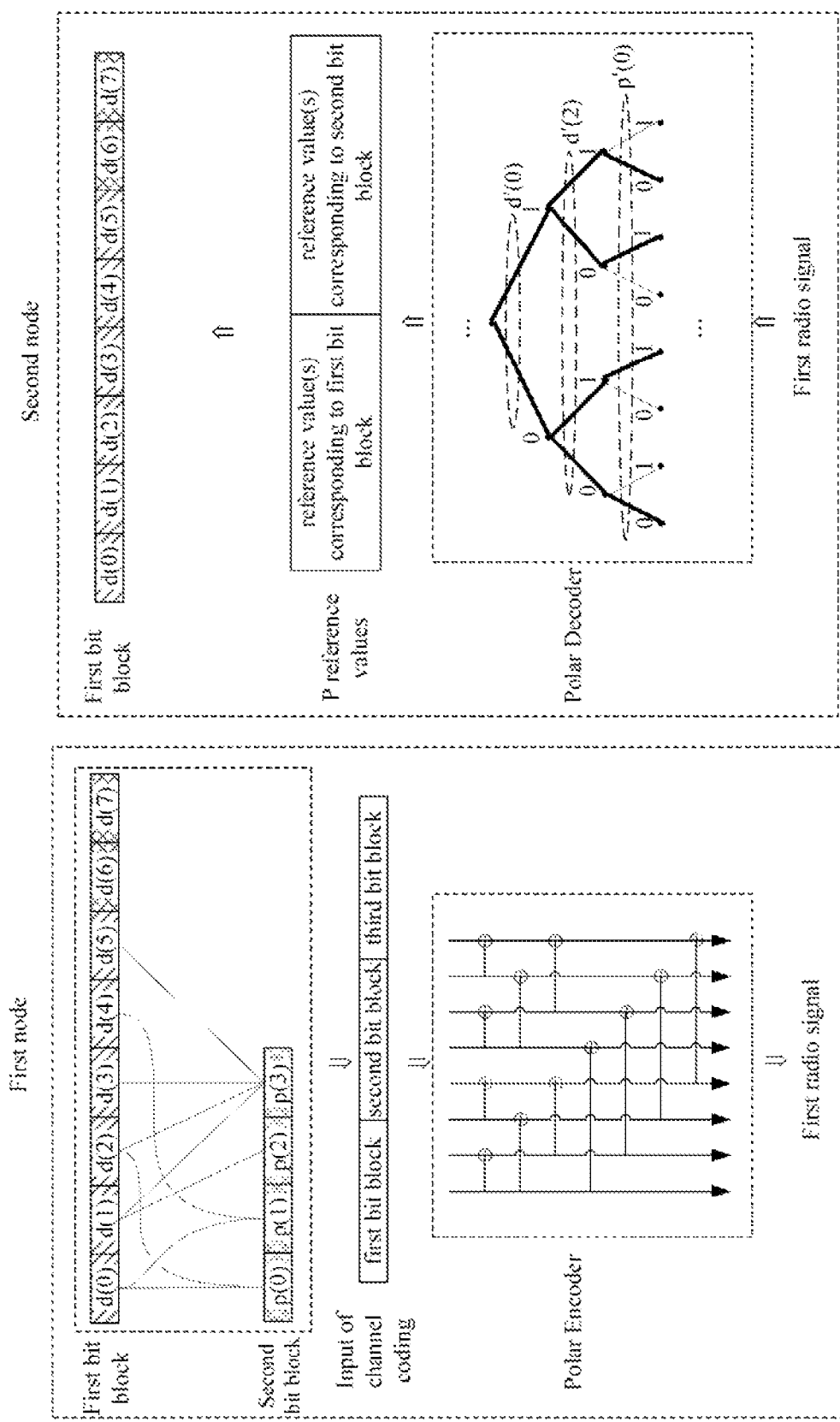
FIG. 6 illustrates a schematic diagram of a relationship between a first bit block and a second bit block and a first radio signal according to one embodiment of the present disclosure.

Embodiment 6 illustrates a schematic diagram of a relationship between a first bit block and a second bit block and a first radio signal, as shown in FIG. 6.

In Embodiment 6, in a first node, bits in the first bit block are used to generate bits in the second bit block. The bits in the first bit block and the bits in the second bit block are both used for an input to channel coding, an output after the channel coding is used to generate the first radio signal. The channel coding is based on a polar code. The first bit block comprises a first bit sub-block and a second bit sub-block, a CRC bit block of the first bit sub-block is used to generate the second bit sub-block. In a second node, the first radio signal is used to generate an input to channel decoding, channel coding corresponding to the channel decoding is based on a polar code. The channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P. Reference values in the P reference values that correspond to the bits in the second bit block are used for pruning in the channel decoding. Reference values in the P reference values that correspond to bits in the second bit sub-block are used to determine whether the first bit block is correctly received. The P is a positive integer greater than 1.

In FIG. 6, the first bit block consists of 8 bits, a bit in the first bit block is represented by d(i), the i is an integer greater than or equal to 0 and less than 8; the second bits block consists of 4 bits, a bit in the second bit block is represented by p(j), the j is an integer greater than or equal to 0 and less than 4. One bit in the first bit block is connected to a related bit in the second bit block via a solid line. A tree diagram in the decoder represents part of paths in the channel decoding related to bit d(0), bit d(2) and bit p(0). Boxes filled with slashes represent the first bit sub-block, and boxes filled with crosses represent the second bit sub-block.

In one embodiment, the P reference values are (received) bits recovered from corresponding (transmitted) bits.

In one embodiment, the P reference values are (received) soft bits recovered from corresponding (transmitted) bits.

In one embodiment, the P reference values are LLRs estimated for corresponding (transmitted) bits.

In one embodiment, the pruning is used to reduce surviving search paths in the channel decoding based on Viterbi principle. For example, in the tree diagram of FIG. 6, paths marked with thick solid lines are surviving search paths, and other paths are deleted search paths.

In one embodiment, a given reference value is a reference value in the P reference values used for pruning. For the given reference value, bits corresponding to a pruned search path are related to a given second type bit, the given second type bit is a bit in the second bit block corresponding to the given reference value. For example, in FIG. 6, a reference value corresponding to p(0) is represented by p'(0), which is used for pruning in the channel decoding. Bits corresponding to the pruned search path are d(0) and d(2). d(0) and d(2) are related to p(0).

In one subembodiment of the above embodiment, for the given reference value, bits corresponding to a pruned search path are used to generate the given second type bit. For example, in FIG. 6, d(0) and d(2) are used to generate p(0).

In one subembodiment of the above embodiment, for the given reference value, a sum of bits corresponding to a pruned search path is subjected to mod2 before acquiring the given second type bit. For example, in FIG. 6, a sum of d(0) and d(2) are subjected to mod2 to generate p(0).

In one subembodiment of the above embodiment, for the given reference value, a sum of bits corresponding to a pruned search path is subjected to mod2 and then to Xor operation with a corresponding bit in a scrambling sequence before acquiring the given second type bit. For example, a sum of d(0) and d(2) are subjected to mod2 and then to Xor operation with a corresponding bit in a scrambling sequence to generate p(0).

In one embodiment, reference values in the P reference values that correspond to bits in the second bit sub-block are used to indicate an identifier of a target receiver of the first radio signal.

In one embodiment, reference values in the P reference values that correspond to bits in the second bit sub-block are used to indicate an identifier of the first node.

In one embodiment, reference values in the P reference values that correspond to bits in the second bit sub-block and reference values in the P reference values that correspond to bits in the first bit sub-block collectively pass CRC check, if the check result turns out to be correct, it is then determined that the first bit block is correctly recovered; otherwise, it is determined that the first bit block is not recovered correctly.

In one embodiment, the includes all bits in the first bit block, all bits in the second bit block and all bits in a third bit block. Values of all bits in the third bit block are pre-set.

In one subembodiment of the above embodiment, all bits in the third bit block are 0, respectively.

In one subembodiment of the above embodiment, the bits in the third bit block are related to an identifier of the target receiver of the first radio signal.

In one subembodiment of the above embodiment, the identifier of the target receiver of the first radio signal is used to generate the bits in the third bit block.

Embodiment 7

Figure 7:
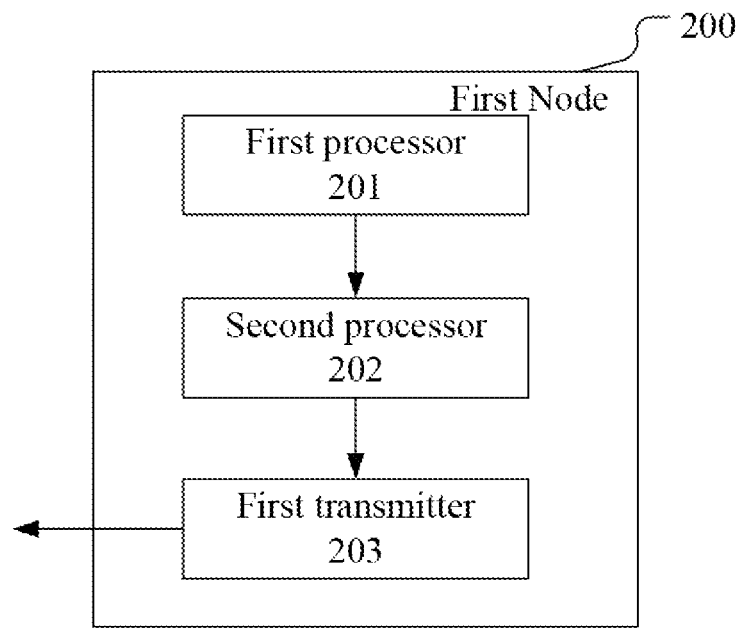
FIG. 7 illustrates a structure block diagram of a processing device in a first node for wireless communication according to one embodiment of the present disclosure.

Embodiment 7 illustrates a structure block diagram of a processing device in a first node for wireless communication, as shown in FIG. 7.

In FIG. 7, a first node device 200 mainly consists of a first processor 201, a second processor 202 and a first transmitter 203.

A first processor 201 generates a first bit block; a second processor 202 performs channel coding; and a first transmitter 203 transmits a first radio signal.

In Embodiment 7, bits in the first bit block are used by the first processor 201 to generate bits in the second bit block. The bits in the first bit block and the bits in the second bit block are both used by the second processor 202 for an input to the channel coding, an output after the channel coding is used by the first transmitter 203 to generate the first radio signal. The channel coding is based on a polar code. For the channel coding, a sub-channel occupied by a target first type bit is related to at least one of a number of bits in the second bit block related to the target first type bit, or numbers of bits in K first type bit sets. The target first type bit belongs to the first bit block. The K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer.

In one embodiment, the higher the number of the bits in the second bit block related to the target first type bit is, the lower a channel capacity corresponding to the sub-channel occupied by the target first type bit will be.

In one embodiment, the less a sum of the numbers of the bits in the K first type bit sets is, the lower a channel capacity corresponding to the sub-channel occupied by the target first type bit will be.

In one embodiment, the greater a sum of reciprocals of the numbers of the bits in the K first type bit sets is, the lower a channel capacity corresponding to the sub-channel occupied by the target first type bit will be.

In one embodiment, the first bit block comprises a first bit sub-block and a second bit sub-block, a CRC bit block of the first bit sub-block is used to generate the second bit sub-block.

In one embodiment, a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, a CRC bit block of the first bit block is used to generate the second bit block.

In one embodiment, the first node is a base station, the first bit block comprises DCI; or the first node is a UE, the first bit block comprises UCI.

Embodiment 8

Figure 8:
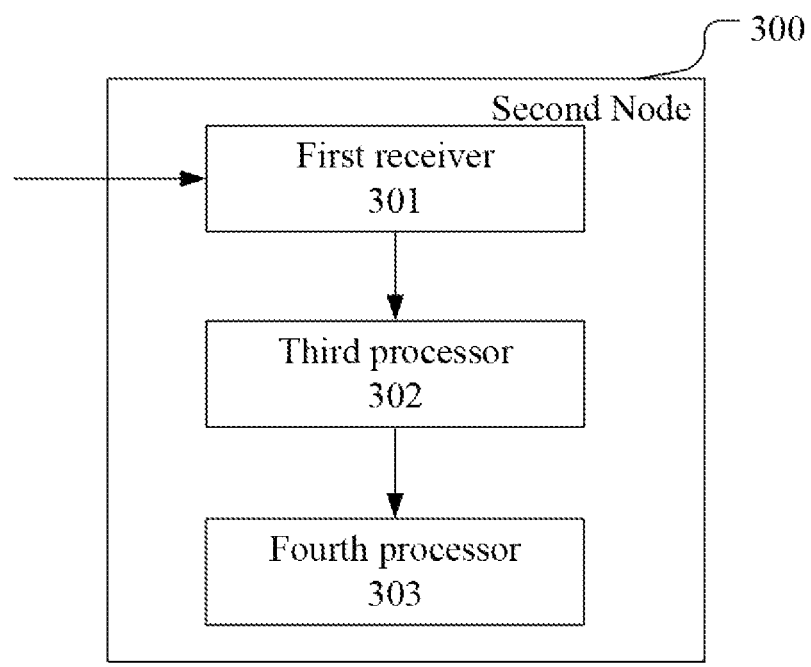
FIG. 8 illustrates a structure block diagram of a processing device in a second node for wireless communication according to one embodiment of the present disclosure.

Embodiment 8 illustrates a structure block diagram of a processing device in a second node for wireless communication, as shown in FIG. 8.

In FIG. 8, a second node device 300 mainly consists of a first receiver 301, a third processor 302 and a fourth processor 303.

A first receiver 301 receives a first radio signal; a third processor 302 performs channel decoding; and a fourth processor 303 recovers a first bit block.

In Embodiment 8, channel coding corresponding to the channel decoding is based on a polar code. Bits in the first bit block are used to generate bits in the second bit block. The bits in the first bit block and the bits in the second bit block are both used for an input to channel coding, an output after the channel coding is used to generate the first radio signal. For the channel coding, a sub-channel occupied by a target first type bit is related to at least one of a number of bits in the second bit block related to the target first type bit, or numbers of bits in K first type bit sets. The target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit. The K is a positive integer.

In one embodiment, an output after the channel decoding is used by the fourth processor 303 to recover the first bit block.

In one embodiment, the higher the number of the bits in the second bit block related to the target first type bit is, the lower a channel capacity corresponding to the sub-channel occupied by the target first type bit will be.

In one embodiment, the less a sum of the numbers of the bits in the K first type bit sets is, the lower a channel capacity corresponding to the sub-channel occupied by the target first type bit will be.

In one embodiment, the greater a sum of reciprocals of the numbers of the bits in the K first type bit sets is, the lower a channel capacity corresponding to the sub-channel occupied by the target first type bit will be.

In one embodiment, the first bit block comprises a first bit sub-block and a second bit sub-block, a CRC bit block of the first bit sub-block is used to generate the second bit sub-block.

In one embodiment, a channel capacity of a sub-channel mapped by any bit in a first bit set is greater than a channel capacity of a sub-channel mapped by any bit in a second bit set; the bits in the first bit block belong to the first bit set, the bits in the second bit block belong to the second bit set; or part of the bits in the first bit block belong to the first bit set, the other part of the bits in the first bit block and the bits in the second bit block belong to the second bit set.

In one embodiment, the channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P. Reference values in the P reference values that correspond to the bits in the second bit block are used for pruning in the channel decoding. Reference values in the P reference values that correspond to bits in the second bit sub-block are used to determine whether the first bit block is correctly received. The P is a positive integer greater than 1.

In one embodiment, a CRC bit block of the first bit block is used to generate the second bit block.

In one embodiment, the second node is a UE, the first bit block comprises DCI; or the second node is a base station, the first bit block comprises UCI.

Embodiment 9

Figure 9:
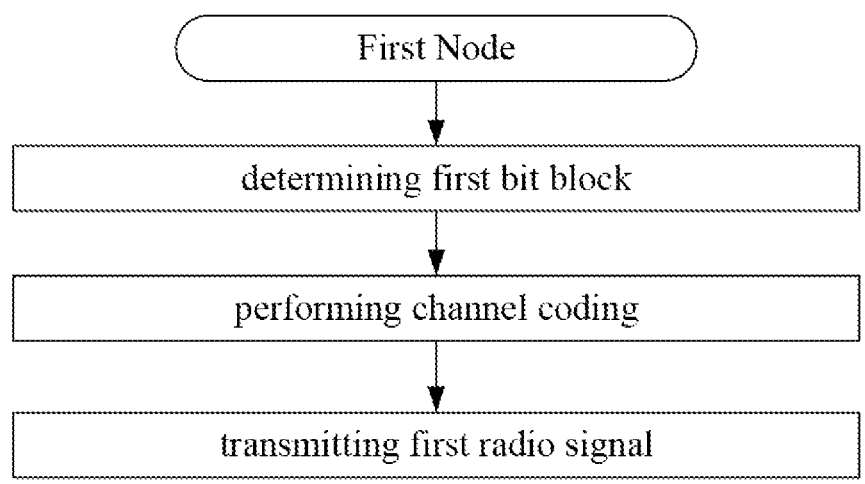
FIG. 9 illustrates a flowchart of a first bit block, channel coding and a first radio signal according to one embodiment of the present disclosure.

Embodiment 9 illustrates a flowchart of a first bit block, channel coding and a first radio signal, as shown in FIG. 9.

In Embodiment 9, the first node in the present disclosure determines a first bit block; performs channel coding; and then transmits a first radio signal. Herein, bits in the first bit block are used to generate bits in a second bit block; the bits in the first bit block and the bits in the second bit block are both used for an input to the channel coding, an output after the channel coding is used to generate the first radio signal; the channel coding is based on a polar code; for the channel coding, a sub-channel occupied by a target first type bit is related to at least one of a number of bits in the second bit block related to the target first type bit, or numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer.

In one embodiment, the sub-channel refers to a position in an input bit sequence of Arikan polar encoder.

In one subembodiment of the above embodiment, an output after the input bit sequence is multiplied by a polar coding matrix is the output after the channel coding. The polar coding matrix is acquired as a product of a bit reversal permutation matrix and a first matrix, the first matrix is the n-th Kronecker power of a kernel matrix, the n is the logarithm of a length of the input bit sequence with base 2, the kernel matrix is a matrix with 2 rows and 2 columns, wherein two elements in a first row are 1 and 0, respectively, and other two elements in a second row are both 1.

In one embodiment, the phrase that the sub-channel occupied by the target first type bit is related to at least one of a number of bits in the second bit block related to the target first type bit, or numbers of bits in K first type bit sets refers to: a channel capacity of a sub-channel occupied by the target first type bit is related to at least one of a number of bits in the second bit block related to the target bit or numbers of bits in K first type bits sets.

In one embodiment, the capacity of the sub-channel is: an upper bound of information rate of reliable transmission on the sub-channel.

In one embodiment, part of the bits in the first bit block are not related to the bits in the second bit block.

In one embodiment, the first bit block is generated on a physical layer of the first node.

In one embodiment, the first node is a base station, the first node generates the first bit block based on a result of scheduling.

In one embodiment, the first node is a UE, the first node generates the first bit block based on scheduling of a base station.

In one embodiment, for any bit in the second bit block, the any bit is equal to a sum of a positive integer number of bit(s) in the first bit block subjected to mod2.

In one embodiment, for any bit in the second bit block, the any bit is acquired after a sum of a positive integer number of bit(s) in the first bit block is subjected to mod2 and then to Xor operation with a corresponding bit in a scrambling sequence.

In one embodiment, the second bit block is not related to bits other than the first bit block.

In one embodiment, the input to the channel coding includes all bits in the first bit block, all bits in the second bit block and all bits in a third bit block. Values of all bits in the third bit block are pre-set.

In one subembodiment of the above embodiment, all bits in the third bit block are 0, respectively.

In one subembodiment of the above embodiment, the bits in the third bit block are related to an identifier of the first node.

In one subembodiment of the above embodiment, an identifier of the first node is used to generate the bits in the third bit block.

In one subembodiment of the above embodiment, the bits in the third bit block are related to an identifier of a target receiver of the first radio signal.

In one subembodiment of the above embodiment, the identifier of the target receiver of the first radio signal is used to generate the bits in the third bit block.

In one embodiment, the first radio signal is transmitted on a physical layer control channel (i.e., a physical layer channel that cannot be used for transmitting physical layer data).

In one embodiment, the first radio signal is transmitted on a physical layer data channel (i.e., a physical layer channel that can be used for bearing physical layer data).

In one embodiment, the first node is a UE.

In one subembodiment of the above embodiment, the first radio signal is transmitted on a PUCCH.

In one subembodiment of the above embodiment, the first radio signal is transmitted on a PUSCH.

In one embodiment, the first node is a base station.

In one subembodiment of the above embodiment, the first radio signal is transmitted on a PDSCH.

In one subembodiment of the above embodiment, the first radio signal is transmitted on a PDCCH.

In one embodiment, the first radio signal is an output after the output of the channel coding is sequentially subjected to Channel Coding, Scrambling, a Modulation Mapper, a Layer Mapper, Precoding, a Resource Element Mapper and broadband symbol generation.

In one embodiment, the first radio signal is an output after the output of the channel coding is sequentially subjected to scrambling, a Modulation Mapper, a Layer Mapper, a transform precoder, Precoding, a Resource Element Mapper and broadband symbol generation In one embodiment, the broadband symbol is an OFDM symbol.

In one embodiment, the broadband symbol is an FBMC symbol.

Embodiment 10

Figure 10:
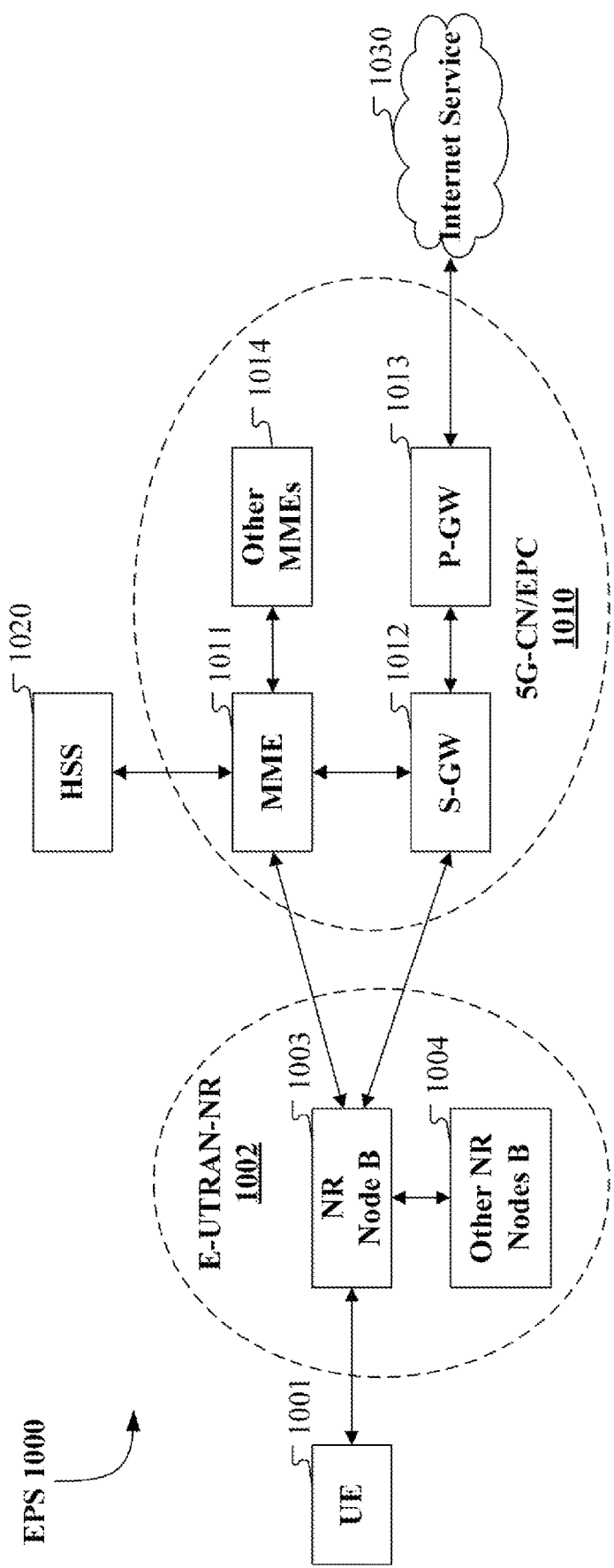
FIG. 10 illustrates a schematic diagram of a network architecture according to one embodiment of the present disclosure.

Embodiment 10 illustrates a schematic diagram of a network architecture, as shown in FIG. 10.

FIG. 10 is a diagram illustrating a network architecture 1000 of Long-Term Evolution (LTE), Long-Term Evolution Advanced (LTE-A) and future 5G systems. The LTE network architecture 1000 may be called an Evolved Packet System (EPS) 1000. The EPS 1000 may comprise one or more UEs 1001, an E-UTRAN-NR 1002, a 5G-Core Network/Evolved Packet Core (EPC/5G-CN) 1010, a Home Subscriber Server (HSS) 1020 and an Internet Service 1030. Herein, UMTS refers to Universal Mobile Telecommunications System. The EPS 1000 may be interconnected with other access networks. For simple description, the entities/interfaces are not shown. As shown in FIG. 10, the EPS 1000 provides packet switching services. Those skilled in the art will find it easy to understand that various concepts presented throughout the present disclosure can be extended to networks providing circuit switching services. The E-UTRAN-NR 1002 comprises an NR node B (gNB) 1003 and other gNBs 1004. The gNB 1003 provides UE 1001 oriented user plane and control plane protocol terminations. The gNB 1003 may be connected to other gNBs 1004 via an X2 interface (for example, backhaul). The gNB 1003 may be called a base station, a base transceiver station, a radio base station, a radio transceiver, a transceiver function, a Base Service Set (BSS), an Extended Service Set (ESS), a Transmitter Receiver Point (TRP) or some other applicable terms. The gNB 1003 provides an access point of the 5G-CN/EPC 1010 for the UE 1001. Examples of UE 1001 include cellular phones, smart phones, Session Initiation Protocol (SIP) phones, laptop computers, Personal Digital Assistant (PDA), Satellite Radios, Global Positioning Systems (GPSs), multimedia devices, video devices, digital audio players (for example, MP3 players), cameras, games consoles, unmanned aerial vehicles, air vehicles, narrow-band physical network equipment, machine-type communication equipment, land vehicles, automobiles, wearable equipment, or any other devices having similar functions. Those skilled in the art also can call the UE 1001 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or some other appropriate terms. The gNB 1003 is connected to the 5G-CN/EPC 210 via an S1 interface. The 5G-CN/EPC 1010 comprises an MME 1011, other MMES 1014, a Service Gateway (S-GW) 1012 and a Packet Date Network Gateway (P-GW) 1013. The MME 1011 is a control node for processing a signaling between the UE 1001 and the 5G-CN/EPC 1010. Generally, the MME 1011 provides bearer and connection management. All user Internet Protocol (IP) packets are transmitted through the S-GW 1012, the S-GW 1012 is connected to the P-GW 1013. The P-GW 1013 provides UE IP address allocation and other functions. The P-GW 1013 is connected to the Internet Service 1030. The Internet Service 1030 comprises IP services corresponding to operators, specifically including Internet, Intranet, IP Multimedia Subsystem (IMS) and Packet Switching Streaming Services (PSSs).

In one embodiment, the UE 1001 corresponds to the first node in the present disclosure, the gNB 1003 corresponds to the second node in the present disclosure.

In one embodiment, the UE 1001 corresponds to the second node in the present disclosure, the gNB 1003 corresponds to the first node in the present disclosure.

Embodiment 11

Figure 11:
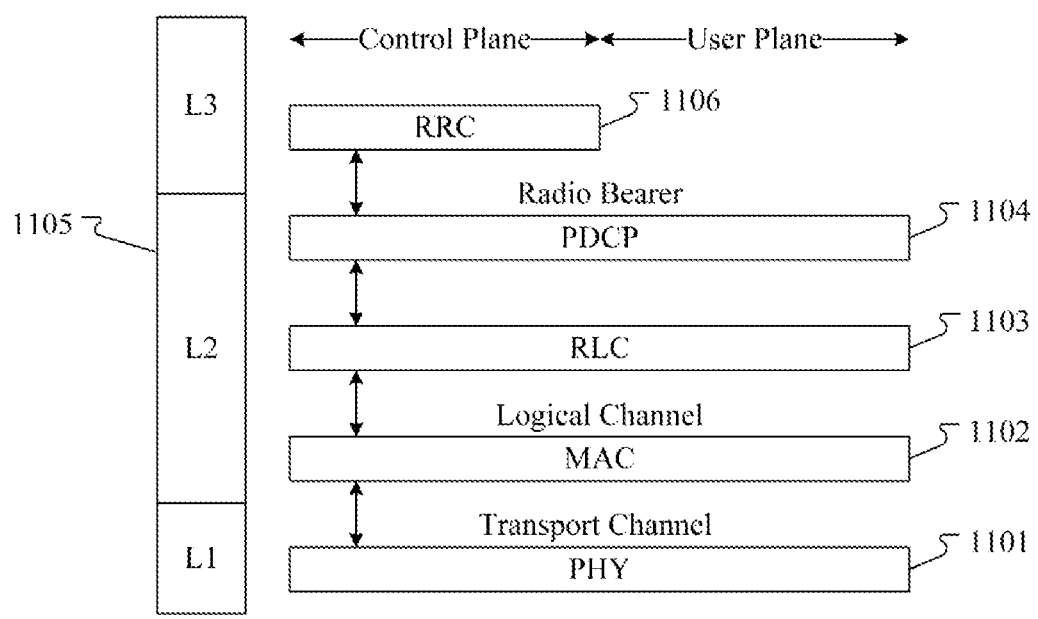
FIG. 11 illustrates a schematic diagram of a radio protocol architecture of a user plane and a control plane according to one embodiment of the present disclosure.

Embodiment 11 illustrates a schematic diagram of a radio protocol architecture of a user plane and a control plane, as shown in FIG. 11.

FIG. 11 is a schematic diagram illustrating a radio protocol architecture of a user plane and a control plane. In FIG. 11, the radio protocol architecture for a UE and a gNB is represented by three layers, which are a layer 1, a layer 2 and a layer 3, respectively. The layer 1 (L1) is the lowest layer and performs signal processing functions of various PHY layers. The L1 is called PHY 1101 in the present disclosure. The layer 2 (L2) 1105 is above the PHY 1101, and is in charge of the link between the UE and the gNB via the PHY 1101. In the user plane, L2 1105 comprises a Medium Access Control (MAC) sublayer 1102, a Radio Link Control (RLC) sublayer 1103 and a Packet Data Convergence Protocol (PDCP) sublayer 1104. All the three sublayers terminate at the gNBs of the network side. Although not described in FIG. 11, the UE may comprise several protocol layers above the L2 1105, such as a network layer (i.e., IP layer) terminated at a P-GW 1013 of the network side and an application layer terminated at the other side of the connection (i.e., a peer UE, a server, etc.). The PDCP sublayer 1104 provides multiplexing among variable radio bearers and logical channels. The PDCP sublayer 1104 also provides a header compression for a higher-layer packet so as to reduce a radio transmission overhead. The PDCP sublayer 304 provides security by encrypting a packet and provides support for UE handover between gNBs. The RLC sublayer 1103 provides segmentation and reassembling of a higher-layer packet, retransmission of a lost packet, and reordering of a packet so as to compensate the disordered receiving caused by Hybrid Automatic Repeat reQuest (HARQ). The MAC sublayer 1102 provides multiplexing between a logical channel and a transport channel. The MAC sublayer 1102 is also responsible for allocating between UEs various radio resources (i.e., resource block) in a cell. The MAC sublayer 1102 is also in charge of HARQ operation. In the control plane, the radio protocol architecture of the UE and the gNB is almost the same as the radio protocol architecture in the user plane on the PHY 1101 and the L2 1105, but there is no header compression for the control plane. The control plane also comprises a Radio Resource Control (RRC) sublayer 1106 in the layer 3 (L3). The RRC sublayer 1106 is responsible for acquiring radio resources (i.e., radio bearer) and configuring the lower layer using an RRC signaling between the gNB and the UE.

In one embodiment, the radio protocol architecture in FIG. 11 is applicable to the first node in the present disclosure.

In one embodiment, the radio protocol architecture in FIG. 11 is applicable to the second node in the present disclosure.

In one embodiment, the first bit block in the present disclosure is generated by the RRC sublayer 1106.

In one embodiment, the first bit block in the present disclosure is generated by the MAC sublayer 1102.

In one embodiment, the first bit block in the present disclosure is generated by the PHY 1101.

In one embodiment, the second bit block in the present disclosure is generated by the PHY 1101.

In one embodiment, the first radio signal in the present disclosure is generated by the PHY 1101.

Embodiment 12

Figure 12:
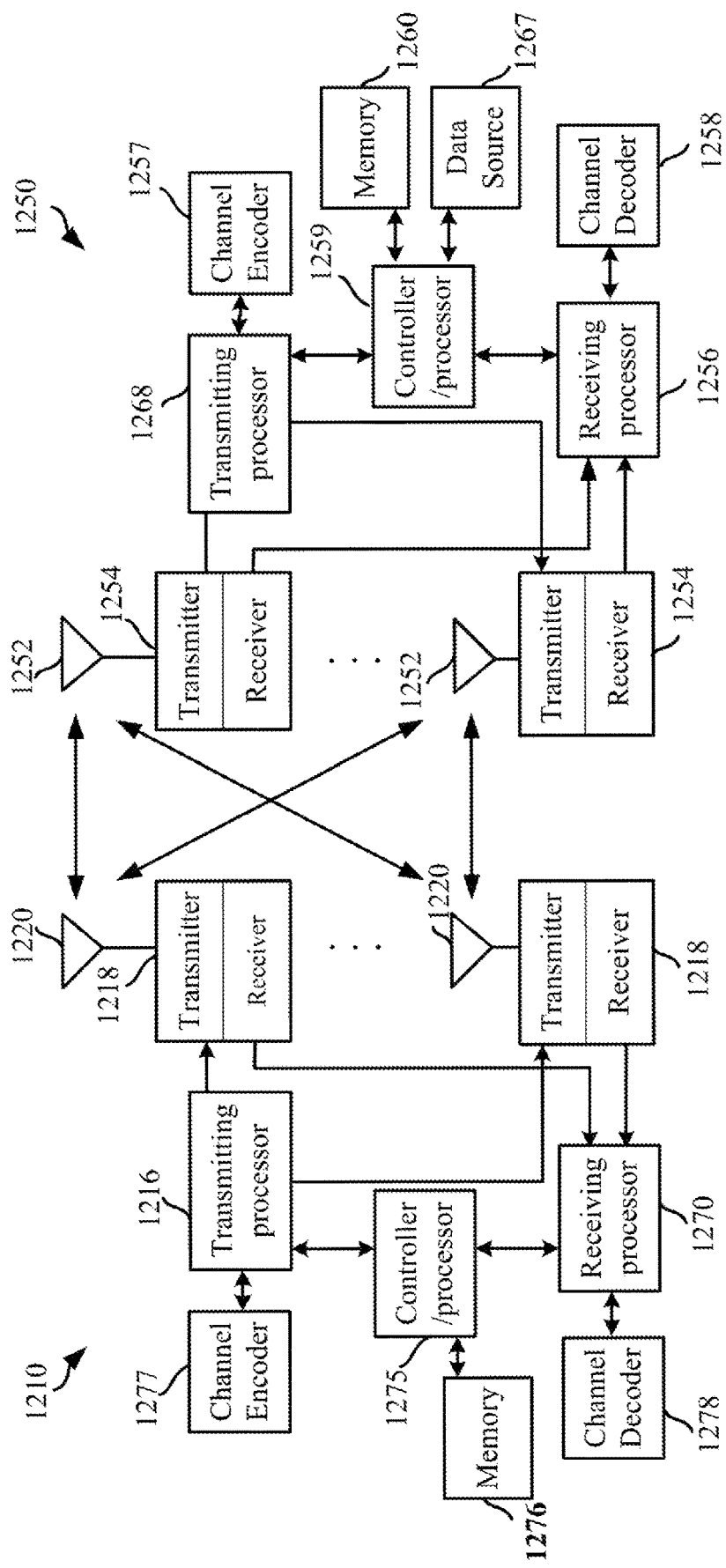
FIG. 12 illustrates a schematic diagram of an evolved node and a UE according to one embodiment of the present disclosure.

Embodiment 12 illustrates a schematic diagram of an evolved node and a UE, as shown in FIG. 12.

A gNB 1210 comprises a controller/processor 1275, a memory 1276, a receiving processor 1270, a transmitting processor 1216, a channel encoder 1277, a channel decoder 1278, a transmitter/receiver 1218 and an antenna 1220.

A UE 1250 comprises a controller/processor 1259, a memory 1260, a data source 1267, a transmitting processor 1268, a receiving processor 1256, a channel encoder 1257, a channel decoder 1258, a transmitter/receiver 1254 and an antenna 1252.

In Downlink (DL) transmission, at the gNB 1210, a higher-layer packet from a core network is provided to the controller/processor 1275. The controller/processor 1275 provides a function of the L2 layer. In DL transmission, the controller/processor 1275 provides header compression, encryption, packet segmentation and reordering, and multiplexing between a logical channel and a transport channel, and radio resource allocation for the UE 1250 based on various priorities. The controller/processor 1275 is also in charge of HARQ operation, retransmission of a lost packet, and a signaling to the UE 1250. The transmitting processor 1216 and the channel encoder 1277 perform signal processing functions used for the L1 layer (that is, PHY). The channel encoder 1277 performs coding and interleaving so as to ensure an FEC (Forward Error Correction) at the UE 1250 side. The transmitting processor 1216 implements the mapping to signal clusters corresponding to each modulation scheme (i.e., BPSK, QPSK, M-PSK, M-QAM, etc.) and performs spatial precoding/beamforming on encoded and modulated symbols to generate one or more spatial streams. The transmitting processor 1216 then maps each spatial stream into a subcarrier. The mapped symbols are multiplexed with a reference signal (i.e., pilot frequency) in time domain and/or frequency domain, and then they are assembled through Inverse Fast Fourier Transform (IFFT) to generate a physical channel carrying time-domain multi-carrier symbol streams. Each transmitter 1218 converts a baseband multicarrier symbol stream provided by the transmitting processor 1216 into a radio frequency (RF) stream. Each radio frequency stream is later provided to different antennas 1220.

In downlink (DL) transmission, at the UE 1250, each receiver 1254 receives a signal via a corresponding antenna 1252. Each receiver 1254 recovers information modulated to the RF carrier, converts the radio frequency stream into a baseband multicarrier symbol stream to be provided to the receiving processor 1256. The receiving processor 1256 and the channel decoder 1258 perform signal processing functions of the L1 layer. The receiving processor 1256 converts the baseband multicarrier symbol stream from time domain into frequency domain using FFT. In frequency domain, a physical layer data signal and a reference signal are de-multiplexed by the receiving processor 1256, wherein a reference signal is used for channel estimation, while physical layer data is subjected to multi-antenna detection in the receiving processor 1256 to recover any UE 1250-targeted spatial stream. Symbols on each spatial stream are demodulated and recovered in the receiving processor 1256 to generate a soft decision. Then the channel decoder 1258 decodes and de-interleaves the soft decision to recover the higher-layer data and control signal transmitted on the physical channel by the gNB 1210. Next, the higher-layer data and control signal are provided to the controller/processor 1259. The controller/processor 1259 performs functions of the L2 layer. The controller/processor 1259 can be connected to a memory 1260 that stores program code and data. The memory 1260 can be called a computer readable medium. In downlink transmission, the controller/processor 1259 provides demultiplexing between a transport channel and a logical channel, packet reassembling, decryption, header decompression and control signal processing so as to recover a higher-layer packet from the core network. The higher-layer packet is later provided to all protocol layers above the L2 layer, or various control signals can be provided to the L3 layer for processing. The controller/processor 1259 also performs error detection using ACK and/or NACK protocols as a way to support HARQ operation.

In uplink (UL) transmission, at the UE 1250, the data source 1267 is configured to provide a higher-layer packet to the controller/processor 1259. The data source 1267 represents all protocol layers above the L2 layer. Similar to a transmitting function of the gNB 1210 described in DL transmission, the controller/processor 1259 performs header compression, encryption, packet segmentation and reordering, and multiplexing between a logical channel and a transport channel based on radio resource allocation of the gNB 1210 so as to provide the L2 layer functions used for the user plane and the control plane. The controller/processor 1259 is also responsible for HARQ operation, retransmission of a lost packet, and a signaling to the gNB 1210. The channel encoder 1257 performs channel coding. Encoded data is modulated into multicarrier/single-carrier symbol streams through modulation and multi-antenna spatial precoding/beamforming performed by the transmitting processor 1268, and then modulated symbol streams are provided from the transmitters 1254 to each antenna 1252. Each transmitter 1254 first converts a baseband symbol stream provided by the transmitting processor 1268 into a radio frequency symbol stream, and then provides the radio frequency symbol stream to the antenna 1252.

In uplink (UL) transmission, the function of the gNB 1210 is similar to the receiving function of the UE 1250 described in DL transmission. Each receiver 1218 receives a radio frequency signal via a corresponding antenna 1220, converts the received radio frequency signal into a baseband signal, and provides the baseband signal to the receiving processor 1270. The receiving processor 1270 and the channel decoder 1278 jointly provide functions of the L1 layer. The controller/processor 1275 provides functions of the L2 layer. The controller/processor 1275 can be connected with the memory 1276 that stores program code and data. The memory 1276 can be called a computer readable medium. In UL transmission, the controller/processor 1275 provides de-multiplexing between a transport channel and a logical channel, packet reassembling, decryption, header decompression, control signal processing so as to recover a higher-layer packet from the UE 1250. The higher-layer packet coming from the controller/processor 1275 may be provided to the core network. The controller/processor 1275 can also perform error detection using ACK and/or NACK protocols to support HARQ operation.

In one embodiment, the UE 1250 comprises at least one processor and at least one memory. The at least one memory includes computer program codes. The at least one memory and the computer program codes are configured to be used in collaboration with the at least one processor. The UE 1250 at least determines the first bit block in the present disclosure; performs the channel coding in the present disclosure; and transmits the first radio signal in the present disclosure.

In one embodiment, the UE 1250 comprises a memory that stores a computer readable instruction program. The computer readable instruction program generates an action when executed by at least one processor. The action includes: determining the first bit block in the present disclosure; performs the channel coding in the present disclosure; and transmitting the first radio signal in the present disclosure.

In one embodiment, the UE 1250 comprises at least one processor and at least one memory. The at least one memory includes computer program codes. The at least one memory and the computer program codes are configured to be used in collaboration with the at least one processor. The UE 1250 at least receives the first radio signal in the present disclosure; performs the channel decoding in the present disclosure; and recovers the first bit block in the present disclosure.

In one embodiment, the UE 1250 comprises a memory that stores a computer readable instruction program. The computer readable instruction program generates an action when executed by at least one processor. The action includes: receiving the first radio signal in the present disclosure; performs the channel decoding in the present disclosure; and recovering the first bit block in the present disclosure.

In one embodiment, the gNB 1210 comprises at least one processor and at least one memory. The at least one memory includes computer program codes. The at least one memory and the computer program codes are configured to be used in collaboration with the at least one processor. The gNB 1210 at least receives the first radio signal in the present disclosure; performs the channel decoding in the present disclosure; and recovers the first bit block in the present disclosure.

In one embodiment, the gNB 1210 comprises a memory that stores a computer readable instruction program. The computer readable instruction program generates an action when executed by at least one processor. The action includes: receiving the first radio signal in the present disclosure; performing the channel decoding in the present disclosure; and recovering the first bit block in the present disclosure.

In one embodiment, the gNB 1210 comprises at least one processor and at least one memory. The at least one memory includes computer program codes. The at least one memory and the computer program codes are configured to be used in collaboration with the at least one processor. The gNB 1210 at least determines the first bit block in the present disclosure; performs the channel coding in the present disclosure; and transmits the first radio signal in the present disclosure.

In one embodiment, the gNB 1210 comprises a memory that stores a computer readable instruction program. The computer readable instruction program generates an action when executed by at least one processor. The action includes: determining the first bit block in the present disclosure; performing the channel coding in the present disclosure; and transmitting the first radio signal in the present disclosure.

In one embodiment, the UE 1250 corresponds to the first node in the present disclosure, the gNB 1210 corresponds to the second node in the present disclosure.

In one embodiment, the UE 1250 corresponds to the second node in the present disclosure, the gNB 1210 corresponds to the first node in the present disclosure.

In one embodiment, at least one of the controller/processor 1259, the memory 1260 or the data source 1267 is used to determine the first bit block; at least one of the transmitting processor 1268, the channel encoder 1257 or the controller/processor 1259 is used to generate the second bit block in the present disclosure; at least one of the receiving processor 1270, the channel decoder 1278, the controller/processor 1275 or the memory 1276 is used to recover the first bit block.

In one embodiment, at least one of the transmitting processor 1268, the channel encoder 1257, the controller/processor 1259, the transmitter 1254 or the antenna 1252 is used to transmit the first radio signal; at least one of the receiving processor 1270, the channel decoder 1278, the controller/processor 1275, the receiver 1218 or the antenna 1220 is used to receive the first radio signal.

In one embodiment, the channel encoder 1257 is used to perform the channel coding in the present disclosure; the channel decoder 1278 is used to perform the channel decoding in the present disclosure.

In one embodiment, at least one of the controller/processor 1275 or the memory 1276 is used to determine the first bit block; at least one of the transmitting processor 1216, the channel encoder 1277 or the controller/processor 1275 is used to generate the second bit block in the present disclosure; at least one of the receiving processor 1256, the channel decoder 1258, the controller/processor 1259, the memory 1260 or the data source 1267 is used to recover the first bit block.

In one embodiment, at least one of the transmitting processor 1216, the channel encoder 1277, the controller/processor 1275, the transmitter 1218 or the antenna 1220 is used to transmit the first radio signal; at least one of the receiving processor 1256, the channel decoder 1258, the controller/processor 1259, the receiver 1254 or the antenna 1252 is used to receive the first radio signal.

In one embodiment, the channel encoder 1277 is used to perform the channel coding in the present disclosure; the channel decoder 1258 is used to perform the channel decoding in the present disclosure.

In one embodiment, the first processor 201 in Embodiment 7 comprises at least one of the transmitting processor 1268, the channel encoder 1257, the controller/processor 1259, the memory 1260 or the data source 1267.

In one embodiment, the second processor 202 in Embodiment 7 comprises the channel encoder 1257.

In one embodiment, the first transmitter 203 in Embodiment 7 comprises at least one of the antenna 1252, the transmitter 1254, the transmitting processor 1268, the channel encoder 1257, the controller/processor 1259, the memory 1260 or the data source 1267.

In one embodiment, the first processor 201 in Embodiment 7 comprises at least one of the transmitting processor 1216, the channel encoder 1277, the controller/processor 1275 or the memory 1276.

In one embodiment, the second processor 202 in Embodiment 7 comprises the channel encoder 1277.

In one embodiment, the first transmitter 203 in Embodiment 7 comprises at least one of the antenna 1220, the transmitter 1218, the transmitting processor 1216, the channel encoder 1277, the controller/processor 1275 or the memory 1276.

In one embodiment, the first receiver 301 in Embodiment 8 comprises at least one of the antenna 1220, the receiver 1218, the receiving processor 1270, the channel decoder 1278, the controller/processor 1275 or the memory 1276.

In one embodiment, the third processor 302 in Embodiment 8 comprises the channel decoder 1278.

In one embodiment, the fourth processor 303 in Embodiment 8 comprises at least one of the receiving processor 1270, the channel decoder 1278, the controller/processor 1275 or the memory 1276.

In one embodiment, the first receiver 301 in Embodiment 8 comprises at least one of the antenna 1252, the receiver 1254, the receiving processor 1256, the channel decoder 1258, the controller/processor 1259, the memory 1260 or the data source 1267.

In one embodiment, the third processor 302 in Embodiment 8 comprises the channel decoder 1258.

In one embodiment, the fourth processor 303 in Embodiment 8 comprises at least one of the receiving processor 1256, the channel decoder 1258, the controller/processor 1259, the memory 1260 or the data source 1267.

The ordinary skill in the art may understand that all or part of steps in the above method may be implemented by instructing related hardware through a program. The program may be stored in a computer readable storage medium, for example Read-Only-Memory (ROM), hard disk or compact disc, etc. Optionally, all or part of steps in the above embodiments also may be implemented by one or more integrated circuits. Correspondingly, each module unit in the above embodiments may be implemented in the form of hardware, or in the form of software function modules. The present disclosure is not limited to any combination of hardware and software in specific forms. The UE or terminal in the present disclosure includes but is not limited to unmanned aerial vehicles, communication modules on unmanned aerial vehicles, telecontrolled aircrafts, aircrafts, diminutive airplanes, mobile phones, tablet computers, notebooks, vehicle-mounted communication equipment, wireless sensor, network cards, terminals for Internet of Things (IOT), RFID terminals, NB-IOT terminals, Machine Type Communication (MTC) terminals, enhanced MTC (eMTC) terminals, data cards, low-cost mobile phones, low-cost tablet computers, etc. The base station or system device in the present disclosure includes but is not limited to macro-cellular base stations, micro-cellular base stations, home base stations, relay base station, gNB (NR node B), Transmitter Receiver Point (TRP), and other radio communication equipment.

The above are merely the preferred embodiments of the present disclosure and are not intended to limit the scope of protection of the present disclosure. Any modification, equivalent substitute and improvement made within the spirit and principle of the present disclosure are intended to be included within the scope of protection of the present disclosure.

What is claimed is:

1. A method in a first node for wireless communication, comprising:
   determining a first bit block;
   performing channel coding; and
   transmitting a first radio signal;
   wherein bits in the first bit block are used to generate bits in a second bit block; any bit in the second bit block is dependent on a sum of a positive integer number of bit(s) in the first bit block subject to mod 2; the bits in the first bit block and the bits in the second bit block are both used for an input to the channel coding, an output after the channel coding is used to generate the first radio signal; the channel coding is based on a polar code; for the channel coding, a polar code sub-channel occupied by a target first type bit is related to numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer; the first node is a base station, the first bit block comprises DCI, and the first radio signal is transmitted on a PDCCH; or, the first node is a UE, the first bit block comprises UCI, and the first radio signal is transmitted on a PUCCH or a PUSCH.

2. The method according to claim 1, wherein a CRC bit block of the first bit block is used to generate the second bit block;
   or, the first bit block comprises a first bit sub-block and a second bit sub-block, a CRC bit block of the first bit sub-block is used to generate the second bit sub-block;
   or, a channel capacity of a polar code sub-channel mapped by any bit in a first bit set is greater than a channel capacity of a polar code sub-channel mapped by any bit in a second bit set, the bits in the first bit block belong to the first bit set, the bits in the second bit block belong to the second bit set;
   or, a channel capacity of a polar code sub-channel mapped by any bit in a first bit set is greater than a channel capacity of a polar code sub-channel mapped by any bit in a second bit set, part of the bits in the first bit block belong to the first bit set, the other part of the bits in the first bit block and the bits in the second bit block belong to the second bit set.

3. The method according to claim 1, wherein the less a sum of the numbers of the bits in the K first type bit sets is, the lower a channel capacity corresponding to the polar code sub-channel occupied by the target first type bit will be;
   or, the greater a sum of reciprocals of the numbers of the bits in the K first type bit sets is, the lower a channel capacity corresponding to the polar code sub-channel occupied by the target first type bit will be.

4. The method according to claim 1, wherein any bit in the second bit block is equal to a sum of a positive integer number of bit(s) in the first bit block subjected to mod 2;
or, any bit in the second bit block is acquired after a sum of a positive integer number of bit(s) in the first bit block is subjected to mod 2 and then to XOR operation with a corresponding bit in a scrambling sequence;
or, the second bit block is a CRC bit block of the first bit block;
or, the second bit block is a bit block after a CRC bit block of the first bit block is subjected to scrambling.

5. The method according to claim 1, wherein the input to the channel coding includes all bits in the first bit block, all bits in the second bit block and all bits in a third bit block; all bits in the third bit block are 0, respectively.

6. A method in a second node for wireless communication, comprising:
receiving a first radio signal;
performing channel decoding; and
recovering a first bit block;
wherein channel coding corresponding to the channel decoding is based on a polar code; bits in the first bit block are used to generate bits in a second bit block; any bit in the second bit block is dependent on a sum of a positive integer number of bit(s) in the first bit block subject to mod 2; the bits in the first bit block and the bits in the second bit block are both used for an input to the channel coding, an output after the channel coding is used to generate the first radio signal; for the channel coding, a polar code sub-channel occupied by a target first type bit is related to numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer; the second node is a UE, the first bit block comprises DCI, and the first radio signal is transmitted on a PDCCH; or, the second node is a base station, the first bit block comprises UCI, and the first radio signal is transmitted on a PUCCH or a PUSCH.

7. The method according to claim 6, wherein a CRC bit block of the first bit block is used to generate the second bit block;
or, the first bit block comprises a first bit sub-block and a second bit sub-block, a CRC bit block of the first bit sub-block is used to generate the second bit sub-block;
or, the first bit block comprises a first bit sub-block and a second bit sub-block, a CRC bit block of the first bit sub-block is used to generate the second bit sub-block, the channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P, reference values in the P reference values that correspond to the bits in the second bit block are used for pruning in the channel decoding, reference values in the P reference values that correspond to bits in the second bit sub-block are used to determine whether the first bit block is correctly received, the P is a positive integer greater than 1;
or, a channel capacity of a polar code sub-channel mapped by any bit in a first bit set is greater than a channel capacity of a polar code sub-channel mapped by any bit in a second bit set, the bits in the first bit block belong to the first bit set, the bits in the second bit block belong to the second bit set;
or, a channel capacity of a polar code sub-channel mapped by any bit in a first bit set is greater than a channel capacity of a polar code sub-channel mapped by any bit in a second bit set, part of the bits in the first bit block belong to the first bit set, the other part of the bits in the first bit block and the bits in the second bit block belong to the second bit set.

8. The method according to claim 6, wherein the less a sum of the numbers of the bits in the K first type bit sets is, the lower a channel capacity corresponding to the polar code sub-channel occupied by the target first type bit will be;
or, the greater a sum of reciprocals of the numbers of the bits in the K first type bit sets is, the lower a channel capacity corresponding to the polar code sub-channel occupied by the target first type bit will be.

9. The method according to claim 6, wherein any bit in the second bit block is equal to a sum of a positive integer number of bit(s) in the first bit block subjected to mod 2;
or, any bit in the second bit block is acquired after a sum of a positive integer number of bit(s) in the first bit block is subjected to mod 2 and then to XOR operation with a corresponding bit in a scrambling sequence;
or, the second bit block is a CRC bit block of the first bit block;
or, the second bit block is a bit block after a CRC bit block of the first bit block is subjected to scrambling.

10. The method according to claim 6, wherein the input to the channel coding includes all bits in the first bit block, all bits in the second bit block and all bits in a third bit block; all bits in the third bit block are 0, respectively;
or, an output after the channel decoding is used to recover the first bit block.

11. A device in a first node for wireless communication, comprising:
a first processor, generating a first bit block;
a second processor, performing channel coding; and
a first transmitter, transmitting a first radio signal;
wherein bits in the first bit block are used to generate bits in a second bit block; any bit in the second bit block is dependent on a sum of a positive integer number of bit(s) in the first bit block subject to mod 2; the bits in the first bit block and the bits in the second bit block are both used for an input to the channel coding, an output after the channel coding is used to generate the first radio signal; the channel coding is based on a polar code; for the channel coding, a polar code sub-channel occupied by a target first type bit is related to numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer; the device in the first node is a base station, the first bit block comprises DCI, and the first radio signal is transmitted on a PDCCH; or, the device in the first node is a UE, the first bit block comprises UCI, and the first radio signal is transmitted on a PUCCH or a PUSCH.

12. The device in the first node according to claim 11, wherein a CRC bit block of the first bit block is used to generate the second bit block;
or, the first bit block comprises a first bit sub-block and a second bit sub-block, a CRC bit block of the first bit sub-block is used to generate the second bit sub-block;
or, a channel capacity of a polar code sub-channel mapped by any bit in a first bit set is greater than a channel capacity of a polar code sub-channel mapped by any bit in a second bit set, the bits in the first bit block belong to the first bit set, the bits in the second bit block belong to the second bit set;
or, a channel capacity of a polar code sub-channel mapped by any bit in a first bit set is greater than a channel capacity of a polar code sub-channel mapped by any bit in a second bit set, part of the bits in the first bit block belong to the first bit set, the other part of the bits in the first bit block and the bits in the second bit block belong to the second bit set.

13. The device in the first node according to claim 11, wherein the less a sum of the numbers of the bits in the K first type bit sets is, the lower a channel capacity corresponding to the polar code sub-channel occupied by the target first type bit will be;
or, the greater a sum of reciprocals of the numbers of the bits in the K first type bit sets is, the lower a channel capacity corresponding to the polar code sub-channel occupied by the target first type bit will be.

14. The device in the first node according to claim 11, wherein any bit in the second bit block is equal to a sum of a positive integer number of bit(s) in the first bit block subjected to mod 2;
or, any bit in the second bit block is acquired after a sum of a positive integer number of bit(s) in the first bit block is subjected to mod 2 and then to XOR operation with a corresponding bit in a scrambling sequence;
or, the second bit block is a CRC bit block of the first bit block;
or, the second bit block is a bit block after a CRC bit block of the first bit block is subjected to scrambling.

15. The device in the first node according to claim 11, wherein the input to the channel coding includes all bits in the first bit block, all bits in the second bit block and all bits in a third bit block; all bits in the third bit block are 0, respectively.

16. A device in a second node for wireless communication, comprising:
a first receiver, receiving a first radio signal;
a third processor, performing channel decoding; and
a fourth processor, recovering a first bit block;
wherein channel coding corresponding to the channel decoding is based on a polar code; bits in the first bit block are used to generate bits in a second bit block; any bit in the second bit block is dependent on a sum of a positive integer number of bit(s) in the first bit block subject to mod 2; the bits in the first bit block and the bits in the second bit block are both used for an input to the channel coding, an output after the channel coding is used to generate the first radio signal; for the channel coding, a polar code sub-channel occupied by a target first type bit is related to numbers of bits in K first type bit sets; the target first type bit belongs to the first bit block, the K first type bit sets respectively correspond to K second type bits, the K second type bits are all bits in the second bit block related to the target first type bit, for any given second type bit in the K second type bits, all bits in the first bit block used to generate the given second type bit constitute a first type bit set in the K first type bit sets corresponding to the given second type bit; the K is a positive integer; the device in the second node is a UE, the first bit block comprises DCI, and the first radio signal is transmitted on a PDCCH; or, the device in the second node is a base station, the first bit block comprises UCI, and the first radio signal is transmitted on a PUCCH or a PUSCH.

17. The device in the second node according to claim 16, wherein a CRC bit block of the first bit block is used to generate the second bit block;
or, the first bit block comprises a first bit sub-block and a second bit sub-block, a CRC bit block of the first bit sub-block is used to generate the second bit sub-block;
or, the first bit block comprises a first bit sub-block and a second bit sub-block, a CRC bit block of the first bit sub-block is used to generate the second bit sub-block, the channel decoding is used to determine P reference values, the P reference values respectively correspond to bits in a target bit group, the target bit group consists of the bits in the first bit block and the bits in the second bit block, a sum of a number of the bits in the first bit block and a number of the bits in the second bit block is the P, reference values in the P reference values that correspond to the bits in the second bit block are used for pruning in the channel decoding, reference values in the P reference values that correspond to bits in the second bit sub-block are used to determine whether the first bit block is correctly received, the P is a positive integer greater than 1;
or, a channel capacity of a polar code sub-channel mapped by any bit in a first bit set is greater than a channel capacity of a polar code sub-channel mapped by any bit in a second bit set, the bits in the first bit block belong to the first bit set, the bits in the second bit block belong to the second bit set;
or, a channel capacity of a polar code sub-channel mapped by any bit in a first bit set is greater than a channel capacity of a polar code sub-channel mapped by any bit in a second bit set, part of the bits in the first bit block belong to the first bit set, the other part of the bits in the first bit block and the bits in the second bit block belong to the second bit set.

18. The device in the second node according to claim 16, wherein the less a sum of the numbers of the bits in the K first type bit sets is, the lower a channel capacity corresponding to the polar code sub-channel occupied by the target first type bit will be;
or, the greater a sum of reciprocals of the numbers of the bits in the K first type bit sets is, the lower a channel capacity corresponding to the polar code sub-channel occupied by the target first type bit will be.

19. The device in the second node according to claim 16, wherein any bit in the second bit block is equal to a sum of a positive integer number of bit(s) in the first bit block subjected to mod 2;
or, any bit in the second bit block is acquired after a sum of a positive integer number of bit(s) in the first bit block is subjected to mod 2 and then to XOR operation with a corresponding bit in a scrambling sequence;
or, the second bit block is a CRC bit block of the first bit block;
or, the second bit block is a bit block after a CRC bit block of the first bit block is subjected to scrambling.

20. The device in the second node according to claim 16, wherein the input to the channel coding includes all bits in the first bit block, all bits in the second bit block and all bits in a third bit block; all bits in the third bit block are 0, respectively;

or, an output after the channel decoding is used to recover the first bit block.

* * * * *